(12) United States Patent
Giterman et al.

(10) Patent No.: US 11,309,008 B2
(45) Date of Patent: Apr. 19, 2022

(54) GAIN CELL EMBEDDED DRAM IN FULLY DEPLETED SILICON-ON-INSULATOR TECHNOLOGY

(71) Applicant: Bar-Ilan University, Ramat-Gan (IL)

(72) Inventors: Robert Giterman, Beer-Sheva (IL); Adam Teman, Tel-Mond (IL)

(73) Assignee: Bar-Ilan University, Ramat-Gan (IL)

( * ) Notice: Subject to any disclaimer, the term of this patent is extended or adjusted under 35 U.S.C. 154(b) by 0 days.

(21) Appl. No.: 17/257,893

(22) PCT Filed: Jul. 9, 2019

(86) PCT No.: PCT/IL2019/050764
§ 371 (c)(1),
(2) Date: Jan. 5, 2021

(87) PCT Pub. No.: WO2020/012470
PCT Pub. Date: Jan. 16, 2020

(65) Prior Publication Data
US 2021/0272616 A1  Sep. 2, 2021

Related U.S. Application Data

(60) Provisional application No. 62/696,372, filed on Jul. 11, 2018.

(51) Int. Cl.
*G11C 11/34* (2006.01)
*G11C 11/404* (2006.01)
(Continued)

(52) U.S. Cl.
CPC ........ *G11C 11/404* (2013.01); *G11C 11/4091* (2013.01); *G11C 11/4096* (2013.01); *G11C 2211/4016* (2013.01)

(58) Field of Classification Search
CPC . G11C 11/404; G11C 11/409; G11C 11/4096; G11C 2211/4016
(Continued)

(56) References Cited

U.S. PATENT DOCUMENTS

| 8,014,195 B2 | 9/2011 | Okhonin et al. |
| 2016/0111534 A1 | 4/2016 | Kumar et al. |
| 2017/0098474 A1* | 4/2017 | Tran ........................ G11C 7/065 |

FOREIGN PATENT DOCUMENTS

| WO | WO 2020/012470 | 1/2020 |
| WO | WO 2020/012470 A8 | 1/2020 |

OTHER PUBLICATIONS

International Preliminary Report on Patentability dated Jan. 21, 2021 From the International Bureau of WIPO Re. Application No. PCT/IL2019/050,764. (7 Pages).
(Continued)

*Primary Examiner* — Huan Hoang

(57) ABSTRACT

An FD-SOI GC-edRAM gain cell includes:
a write bit line terminal connected to a WBL;
a read bit line terminal connected to a RBL;
a write trigger terminal connected to a WWL, for inputting a write trigger signal;
a read trigger terminal put connected to a RWL, for inputting a read trigger signal;
at least one body voltage terminal connected to a respective body voltage; and
multiple FD-SOI transistors.
The FD-SOI transistors are interconnected to form a storage node for retaining a data signal. The bodies of at least two of the transistors are coupled in a single well to a body voltage terminal. The write trigger signal triggers writing an input data signal from the write bit line terminal to the
(Continued)

storage node and the read trigger signal triggers outputting the retained data signal from the storage node to the read bit line terminal.

29 Claims, 26 Drawing Sheets

(51) Int. Cl.
  *G11C 11/4091* (2006.01)
  *G11C 11/4096* (2006.01)
(58) Field of Classification Search
  USPC .......................................................... 365/182
  See application file for complete search history.

(56) References Cited

OTHER PUBLICATIONS

International Search Report and the Written Opinion dated Oct. 7, 2019 From the International Searching Authority Re. Application No. PCT/IL2019/050,764. (12 Pages).
Choi et al. "A Refresh-Less eDRAM Macro With Embedded Voltage Reference and Selective Read for an Area and Power Efficient Viterbi Decoder", IEEE Journal of Solid-State Circuits, 50(10): 2451-2462, Published Online Sep. 24, 2015.
Chun et al. "A 667 MHz Logic-Compatible Embedded DRAM Featuring an Asymmetric 2T Grain Cell for High Speed On-Die Caches", IEEE Journal of Solid-State Circuits, 47(2): 547-559, Published Online Jan. 27, 2012.
Giterman et al. "4T Gain-Cell With Internal-Feedback for Ultra-Low Retention Power at Scaled CMOS Nodes", 2014 IEEE International Symposium on Circuits and Systems, ISCAS, Melbourne, VIC, Australia, Jun. 1-5, 2014, p. 1-4, Jun. 1, 2014.
Giterman et al. "A 4-Transistor nMOS-Only Logic-Compatible Gain-Cell Embedded DRAM With Over 1.6-Ms Retention Time at 700 mV in 28-Nm FD-SOI", IEEE Transactions on Circuits and Systems—I: Regular Papers, 65(4): 1245-1256, Apr. 2018.
Giterman et al. "An 800 Mhz Mixed-VT 4T Gain-Cell Embedded DRAM in 28 Nm CMOS Bulk Process for Approximate Computing Applications", Proceedings of the 43rd IEEE European Solid-State Circuits Conference, ESSCIRC '17, Leuven, Belgium, Sep. 11-14, 2017, p. 308-311, Sep. 11, 2017.
Giterman et al. "GC-eDram With Body-Bias Compensated Readout and Error Detection in 28nm FD-SOI", IEEE Transactions on Circuits and Systems II: Express Briefs, p. 1-5, Jan. 30, 2019.
ITRS "Executive Report", The International Technology Roadmap for Semiconductors 2.0, 2015 Edition, p. 1-69, 2015.
Meinerzhagen et al. "Gain-Cell Embedded DRAMs for Low-Power VLSI Systems-on-Chip", Springer, Chap. 1-8: 1-145, 2018.
Meinerzhagen et al. "Impact of Body Biasing on the Retention Time of Gain-Cell Memories", The Journal of Engineering, 2013(8): 19-22, Published Online Jul. 18, 2013.
Park et al. "Low-Power High-Throughput LDPC Decoder Using Non-Refresh Embedded DRAM", IEEE Journal of Solid-State Circuits, 49(3): 783-794, Published Online Mar. 5, 2014.
Somasekhar et al. "2 GHz 2 Mb 2T Gain Cell Memory Macro With 128 GBytes/Sec Bandwidth in A 65 Nm Logic Process Technology", IEEE Journal of Solid-State Circuits, 44(1): 174-185, Published Online Dec. 24, 2008.

\* cited by examiner

GAIN CELL EMBEDDED DRAM IN FULLY DEPLETED SILICON-ON-INSULATOR TECHNOLOGY

RELATED APPLICATIONS

This application is a National Phase of PCT Patent Application No. PCT/IL2019/050764 having International filing date of Jul. 9, 2019, which claims the benefit of priority under 35 USC § 119(e) of U.S. Provisional Patent Application No. 62/696,372 filed on Jul. 11, 2018. The contents of the above applications are all incorporated by reference as if fully set forth herein in their entirety.

FIELD AND BACKGROUND OF THE INVENTION

The present invention, in some embodiments thereof, relates to gain cell embedded DRAM (GC-eDRAM) and, more particularly, but not exclusively, to GC-eDRAM in fully depleted silicon-on-insulator (FD-SOI) technology.

As technology dimensions continue to scale down, high density embedded memories are of great interest for many VLSI systems. However in modern microprocessors and other VLSI Systems-on-Chip (SoC) Static random-access memory (SRAM) arrays often limit the energy efficiency of SoCs due to large design guard-bands, which are required to retain reliable operation under Process-Voltage-Temperature (PVT) variations. For example, six-transistor (6T) SRAM cells incur a large area penalty and suffer from high static power consumption in scaled CMOS nodes, often dominating the total area and power budget of a system. Furthermore, decreased noise margins limit the voltage scaling capability of 6T SRAM arrays. This problem is aggravated due to the impact of PVT variations at deeply-scaled technology nodes and low voltages.

Gain-cell embedded DRAM (GC-eDRAM) has emerged as an alternative to SRAM, featuring low bitcell area, non-destructive readout, low leakage and two-port operation. However, its dynamic storage mechanism requires power-hungry refresh cycles to retain data due to its dynamic storage mechanism. The refresh rate is set according to the data retention time (DRT) of the array, which has been decreasing with technology scaling due to increased leakage currents. The guard-band design style of GC-eDRAM requires the refresh rate to be set based on the lowest possible DRT, which varies significantly with PVT and operating frequency. GC-eDRAM suffers from high access latency compared to SRAM, due to degraded levels in the cell which reduce the bit-line current during readout operations. Hence, large design guard bands and performance margins are needed to ensure reliable operation under process variability.

Additional background art includes:
[1] ITRS, "International Technology Roadmap for Semiconductors—2015 Edition," 2015. [Online]. Available: www(dot)itrs2(dot)net
[2] P. Meinerzhagen et al., "Gain-Cell Embedded DRAMs for Low-Power VLSI Systems-on-Chip". Springer International Publishing, 2018.
[3] D. Somasekhar et al., "2 GHz 2 Mb 2T Gain Cell Memory Macro with 128 GBytes/sec Bandwidth in a 65 nm Logic Process Technology," IEEE J. Solid-State Circuits, vol. 44, no. 1, pp. 174-185, 2009.
[4] K. C. Chun et al., "A 667 MHz Logic-Compatible Embedded DRAM Featuring an Asymmetric 2T Gain Cell for High Speed On-Die Caches," IEEE J. Solid-State Circuits, vol. 47, no. 2, pp. 547-559, 2012.
[5] Y. S. Park et al., "Low-Power High-Throughput LDPC Decoder Using Nonrefresh Embedded DRAM," IEEE J. Solid-State Circuits, vol. 49, no. 3, pp. 783-794, 2014.
[6] W. Choi et al., "A Refresh-Less eDRAM Macro With Embedded Voltage Reference and Selective Read for an Area and Power Efficient Viterbi Decoder," IEEE J. Solid-State Circuits, vol. 50, no. 10, pp. 2451-2462, October 2015.
[7] R. Giterman et al., "A 4-Transistor nMOS-Only Logic-Compatible Gain-Cell Embedded DRAM With Over 1.6-ms Retention Time at 700 mV in 28-nm FD-SOI," IEEE Trans. Circuits Syst. I, vol. 65, no. 4, pp. 1245-1256, April 2018.
[8] R. Giterman et al., "An 800 Mhz Mixed-VT 4T Gain-Cell Embedded DRAM in 28 nm CMOS Bulk Process for Approximate Computing Applications," in Proc. of IEEE European Solid-State Circuits Conference (ESSCIRC), 2017.

SUMMARY OF THE INVENTION

Some embodiments of the invention are of a GC-eDRAM bitcell in FD-SOI technology which includes PMOS and NMOS transistors residing in the same well. This special structure enables the usage of body-bias to extend the cell's DRT using reversed body bias while at the same time improving the read access latency using forward body bias.

In alternate or additional embodiments of the invention, body-biasing is applied to readout circuitry implemented in FD-SOI technology. This enables maximizing the DRT according to the fabricated process corner and current operating conditions. In addition, the large guard bands of conventional memory designs may be reduced by applying dual-sampling, which enables timing error detection, leading to energy efficiency improvement.

According to an aspect of some embodiments of the present invention there is provided an FD-SOI GC-edRAM gain cell. The gain cell includes:
a write bit line terminal connected to a write bit line (WBL);
a read bit line terminal connected to a read bit line (RBL);
a write trigger terminal connected to a write word line (WWL), for inputting a write trigger signal;
a read trigger terminal put connected to a read word line (RWL), for inputting a read trigger signal;
at least one body voltage terminal connected to a respective body voltage; and
multiple FD-SOI transistors.
The FD-SOI transistors are interconnected to form a storage node which retains a data signal, and the bodies of at least two of the transistors are coupled in a single well to a respective body voltage terminal. The write trigger signal triggers writing an input data signal from the write bit line terminal to the storage node and the read trigger signal triggers outputting the retained data signal from the storage node to the read bit line terminal.

According to some embodiments of the invention, the FD-SOI transistors include at least one write transistor and at least one read transistor. The gate of one of the write transistor(s) is connected to the write trigger terminal, so that when a write operation is triggered by the WWL the write bit line terminal is connected to the storage node. The gate of one of the read transistor(s) is connected to the storage node. When a read operation is triggered by the RWL the read bit line terminal and a diffusion connection of at least one of the read transistors are connected and disconnected according to a voltage level at the storage node.

According to some embodiments of the invention, at least two additional ones of the FD-SOI transistors are coupled in a second single well to a second body voltage terminal.

According to some embodiments of the invention, the FD-SOI transistors include at least one PMOS transistor and at least one NMOS transistor.

According to some further embodiments of the invention, the at least one PMOS transistor is a regular voltage threshold (RVT) transistor and the at least one NMOS transistor is a low voltage threshold (LVT) transistor, and the single well is an n-well. According to yet further embodiments of the invention, the respective body voltage is a maximal bulk voltage of the first and second transistors.

According to some alternate embodiments of the invention, the at least one PMOS transistor is an LVT transistor and the at least one NMOS transistor is an RVT transistor, and the single well is a p-well. According to yet further alternate embodiments of the invention, the respective body voltage is a minimal bulk voltage of the first and second transistors.

According to some embodiments of the invention, the gain cell further includes an error detector connected to the read bit line terminal. The error detector includes:
  a fast sense inverter, which provides a first data output signal based on a signal at the read bit line terminal and a first switching threshold;
  a slow sense inverter, which provides a second data output signal based on the signal at the read bit line terminal and a second switching threshold; and
  a comparator which outputs an error signal when the first data output signal and the second data output signal are different,
The fast sense inverter provides the first output data signal faster than the slow sense inverter provides the second output data signal. The respective switching speeds of the sense inverters are dependent on respective levels of the first switching threshold and the second switching threshold.

According to some embodiments of the invention, the fast sense inverter is powered by a boosted supply voltage and the slow sense inverter is powered by a high supply voltage, and the difference between respective levels of the boosted supply voltage and the high power supply yields different respective switching thresholds for the fast sense inverter and the slow sense inverter.

According to some embodiments of the invention, the fast sense inverter includes an FD-SOI PMOS transistor and an FD-SOI NMOS transistor in series, and at least one of the transistors of the fast sense inverter is body-biased. According to some further embodiments of the invention, the respective voltage of the body-biasing is adjustable during gain cell operation.

According to some embodiments of the invention, at least one of the fast sense inverter and the slow sense inverter is enabled and disabled by a respective enable signal.

According to an aspect of some embodiments of the present invention there is provided a memory array which includes multiple FD-SOI GC-eDRAM gain cells. Each gain cell includes:
  a write bit line terminal connected to a write bit line (WBL);
  a read bit line terminal connected to a read bit line (RBL);
  a write trigger terminal connected to a write word line (WWL) for inputting a write trigger signal;
  a read trigger terminal put connected to a read word line (RWL) for inputting a read trigger signal;
  at least one body voltage terminal connected to a respective body voltage; and
  multiple FD-SOI transistors.

The FD-SOI transistors are interconnected to form a storage node which retains a data signal, and the bodies of at least two of the transistors are coupled in a single well to a respective body voltage terminal. The write trigger signal triggers writing an input data signal from the write bit line terminal to the storage node and the read trigger signal triggers outputting the retained data signal from the storage node to the read bit line terminal. The respective write bit line terminals of the gain cells are connected to a common write bit line, and respective read bit line terminals of the gain cells are connected to a common read bit line.

According to some embodiments of the invention, at least one of the gain cells includes at least one PMOS transistor and at least one NMOS transistor. According to some further embodiments of the invention, the at least one PMOS transistor is a regular voltage threshold (RVT) transistor and the at least one NMOS transistor is a low voltage threshold (LVT) transistor, and the single well is an n-well. According to some alternate embodiments of the invention, the at least one PMOS transistor is an LVT transistor and the at least one NMOS transistor is an RVT transistor, and the single well is a p-well.

According to some embodiments of the invention, the memory array further includes an error detector. The error detector includes:
  a fast sense inverter, which provides a first data output signal based on a signal at the read bit line terminal and a first switching threshold;
  a slow sense inverter, which provides a second data output signal based on the signal at the read bit line terminal and a second switching threshold; and
  a comparator which outputs an error signal when the first data output signal and the second data output signal are different,
The fast sense inverter provides the first output data signal faster than the slow sense inverter provides the second output data signal. The respective switching speeds of the sense inverters are dependent on respective levels of the first switching threshold and the second switching threshold.

According to an aspect of some embodiments of the present invention there is provided a method of storing data in a gain cell. The gain cell includes:
  a write bit line terminal connected to a write bit line (WBL);
  a read bit line terminal connected to a read bit line (RBL);
  a write trigger terminal connected to a write word line (WWL) for inputting a write trigger signal;
  a read trigger terminal put connected to a read word line (RWL) for inputting a read trigger signal;
  at least one body voltage terminal connected to a respective body voltage; and
  multiple FD-SOI transistors.

The FD-SOI transistors are interconnected to form a storage node which retains a data signal, and the bodies of at least two of the transistors are coupled in a single well to a respective body voltage terminal. The write trigger signal triggers writing an input data signal from the write bit line terminal to the storage node and the read trigger signal triggers outputting the retained data signal from the storage node to the read bit line terminal. The method includes: writing data to the gain cell, when a write operation is triggered by the write trigger signal, by connecting the write bit line terminal and the storage node via the at least one write transistor using the write trigger signal; and reading data from the gain cell, when a read operation is triggered by the read trigger signal, by connecting and disconnecting the read bit line terminal and a diffusion connection of one of the read transistors based on a voltage level at the storage node.

According to some embodiments of the invention, the diffusion connection of the read transistor is connected to one of:
- a supply voltage;
- ground; and
- the read trigger terminal.

According to some embodiments of the invention, the FD-SOI transistors include at least one PMOS transistor and at least one NMOS transistor. According to some further embodiments of the invention, the at least one PMOS transistor is a regular voltage threshold (RVT) transistor and the at least one NMOS transistor is a low voltage threshold (LVT) transistor, and the single well is an n-well. According to some alternate embodiments of the invention, the at least one PMOS transistor is an LVT transistor and the at least one NMOS transistor is an RVT transistor, and the single well is a p-well.

According to an aspect of some embodiments of the present invention there is provided a body-biased sense inverter which includes:
- an input terminal;
- a data output terminal;
- a first FD-SOI PMOS transistor having a first diffusion connection, a gate connection, a second diffusion connection and a bulk connection; and
- a first FD-SOI NMOS transistor having a first diffusion connection, a gate connection, a second diffusion connection and a bulk connection, At least one of the bulk connections is connected to a respective body voltage, the gate connections of the first PMOS transistor and the first NMOS transistor are connected to the data input terminal, and the second diffusion connection of the first PMOS transistor and the first diffusion connection of the first NMOS transistor are connected to the data output terminal.

According to some embodiments of the invention, the sense inverter includes one of:
i) a second FD-SOI PMOS transistor between the first diffusion connection of the first PMOS transistor and a high supply voltage. The second FD-SOI PMOS transistor connects and disconnects the first diffusion connection of the first PMOS transistor and the high supply voltage in accordance with a respective enable signal; and
ii) a direct connection between the first diffusion connection of the first PMOS transistor and the high supply voltage.

According to some embodiments of the invention, the sense inverter includes one of:
i) a second FD-SOI NMOS transistor between the second diffusion connection of the first NMOS transistor and a low supply voltage. The second FD-SOI NMOS transistor connects and disconnects the second diffusion connection of the first NMOS transistor and the low supply voltage in accordance with a respective enable signal; and
ii) a direct connection between the second diffusion connection of the first NMOS transistor and the low supply voltage.

According to some embodiments of the invention, at least one of the body voltages is dynamically adjustable during operation of the body-biased sense inverter.

According to some embodiments of the invention, the sense inverter further includes a non-biased sense inverter. The non-biased sense inverter includes:
- a third FD-SOI PMOS transistor having a first diffusion connection, a gate connection, a second diffusion connection and a bulk connection;
- a third FD-SOI NMOS transistor having a first diffusion connection, a gate connection, a second diffusion connection and a bulk connection; and
- a comparator having an error detection output terminal, a first input connected to the data output terminal and a second input connected to the second diffusion connection of the third PMOS transistor and the first diffusion connection of the third NMOS transistor, and which outputs an error signal at the error detection output terminal when respective signals at the first input and at the second input are different.

The bulk connection of the third PMOS transistor and the first diffusion connection of the third PMOS transistor are connected to a high supply voltage, the gate connections of the third PMOS transistor and the third NMOS transistor are connected to the data input terminal, and the bulk connection of the third NMOS transistor and the second diffusion connection of the third NMOS transistor are connected to a low supply voltage.

According to some embodiments of the invention, the sense inverter further includes at least one of:
i) a fourth FD-SOI PMOS transistor between the first diffusion connection of the third PMOS transistor and the high supply voltage, which connects and disconnects the first diffusion connection of the first PMOS transistor and the high supply voltage in accordance with a respective enable signal; and
ii) a fourth FD-SOI NMOS transistor between the second diffusion connection of the third NMOS transistor and the low supply voltage, which connects and disconnects the second diffusion connection of the first NMOS transistor and the low supply voltage in accordance with a respective enable signal.

According to some embodiments of the invention, the sense inverter further includes a body-bias supply which provides at least one of the body voltages.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
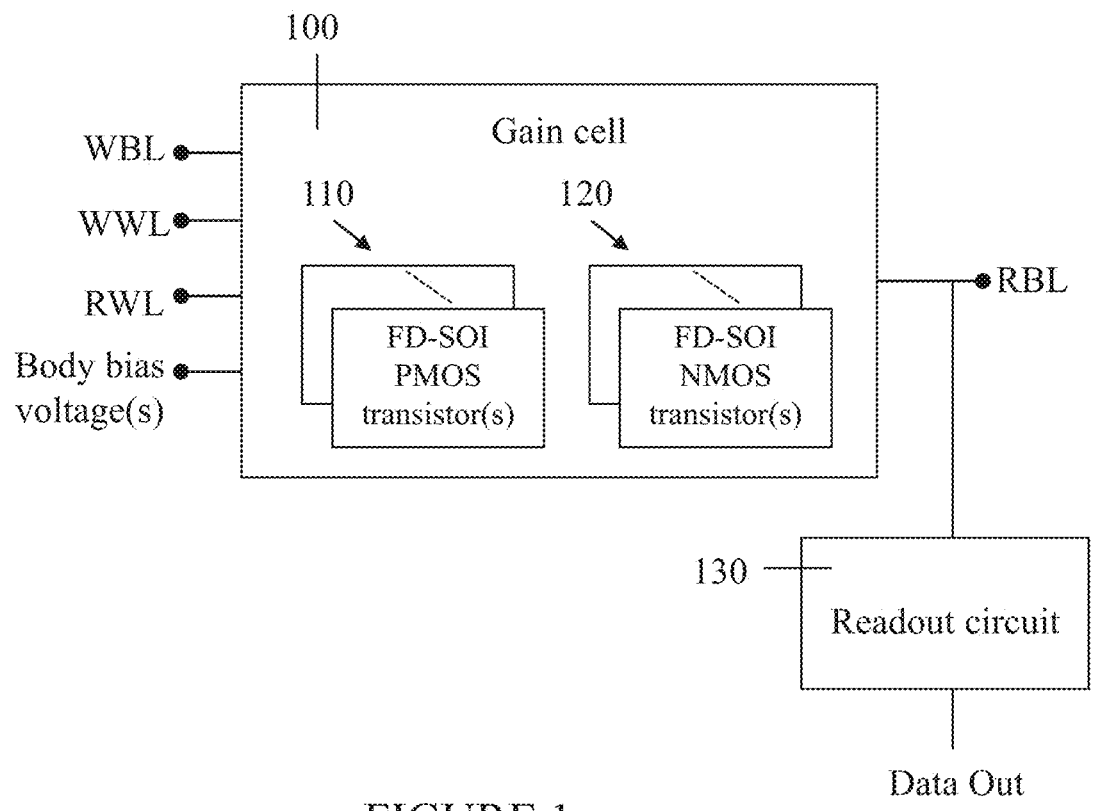
FIG. 1 is a simplified block diagram of a gain cell according to embodiments of the invention.

The present invention, in some embodiments thereof, relates to gain cell embedded DRAM (GC-eDRAM) and, more particularly, but not exclusively, to GC-eDRAM in fully depleted silicon-on-insulator (FD-SOI) technology.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

I. Gain-Cell Embedded DRAM (GC-eDRAM) with Body-Biasing in FD-SOI

FD-SOI technology is capable of manufacturing PMOS and NMOS transistors in a single well (n-well or p-well). This enables body-biasing multiple PMOS and/or NMOS transistors in the same circuit with the same body voltage. This special structure enables the usage of body-bias to extend the cell's DRT using reversed body bias, while at the same time improving the read access latency using forward body bias.

Moreover, the body biasing capabilities of FD-SOI enable post-manufacturing adaptation to process-voltage-temperature variations, as well as the specifications of target applications. For example, the applied body voltage of gain-cell arrays offers a trade-off between consumed static power due to leakage currents and write/read access latency.

Embodiments of the invention may be implemented in any current or future FD-SOI technology. Currently, 28 nanometer (nm), 22 nm and 14 nm FD-SOI technologies are available. Future technologies may go below 14 nm.

I.A. FD-SOI GC-eDRAM with Body-Biasing

Reference is now made to FIG. 1, which is a simplified block diagram of a gain cell according to embodiments of the invention. Gain cell 100 includes two or more FD-SOI transistors, optionally implemented in 28 nm FD-SOI. FIG. 1 illustrates the non-limiting embodiment where the gain cell includes both PMOS and NMOS transistors. It is noted that the number and type of transistors forming the gain cell and the interconnections amongst them are not limited to a particular combination of transistor types. For example, the two-transistor (2T) gain cell embodiment in FIG. 2A includes two NMOS transistors whereas the 2T gain cells in FIGS. 2B and 2C includes one NMOS transistor and one PMOS transistor. Furthermore, the gain cell transistors may have the same or different voltage thresholds (e.g. see FIGS. 2A and 2B respectively).

The gain cell transistors may have the same or different respective widths and/or lengths.

As used herein the term "transistor" means an FD-SOI transistor, unless a different transistor type is explicitly stated.

As used herein the terms "gain cell" and "bitcell" mean a circuit element for storing a signal representing one bit of data.

Gain cell 100 includes terminals for inputting/outputting signals to perform data storage by gain cell 100, and also one or more terminals to apply body voltage(s) to some or all of the transistors forming gain cell 100. These terminals include:

i) a write bit line terminal connected to a write bit line (WBL). The WBL provides the signal to be written to the gain cell;
ii) a read bit line terminal connected to a read bit line (RBL). The signal read from the gain cell is provided to the RBL;
iii) a write trigger terminal connected to a write word line (WWL). The WWL provides the write trigger signal;
iv) a read trigger terminal put connected to a read word line (RWL). The RWL provides the read trigger signal;
v) one or more body voltage terminal(s) connected to respective body voltage(s).

As used herein the term "terminal" means an electrical connection through which signals may be input to or output from the gain cell. The term terminal is not intended to imply that there is necessarily a separate object forming a physical connector and is intended to include electrical connections with other elements of an electrical circuit. An example is a memory array which contains multiple gain cells connecting in parallel to wires (such as WWL, RWL, WBL, RBL etc.) on a circuit board.

Gain cell 100 additionally includes multiple fully depleted silicon-on-insulator (FD-SOI) PMOS and/or NMOS transistors (110 and 120 respectively). The bodies (i.e. bulk connections) of two or more of the transistors are coupled in a single well to a first body voltage terminal.

Optionally more than one body voltage is applied to gain cell 100. Each body voltage terminal is connected to the bulk connections of a sub-set of the transistors which form gain cell 100. Thus different body voltage levels may be applied to each sub-set of transistors. Each sub-set may include a single transistor or multiple transistors.

Optionally, all of the transistors forming gain cell 100 are body-biased. Alternately, only some of the transistors forming gain cell 100 are body-biased.

As used herein the term "body-biasing" and "body-biased" mean that a voltage is applied to the transistor's bulk connection.

As used herein the terms "body voltage" and $V_{BB}$ mean the voltage that is applied to the transistor's bulk connection.

The transistors are interconnected to form a storage node for retaining a data signal at a storage node (SN) of gain cell 100. A write trigger signal at the WWL terminal triggers writing an input data signal from the WBL terminal to the storage node; and a read trigger signal at the RWL terminal triggers outputting a '0' or '1' signal level to the RBL terminal based on the voltage level at SN.

Optionally, the gain cell transistors include at least one write transistor having a gate connected to the write trigger terminal and at least one read transistor having a gate connected to the storage node. The write transistors are connected to form a conductive path between the WBL terminal and the storage node when a write operation is triggered from the WWL terminal. The read transistors are connected so that when a read operation is triggered from the RWL terminal the RBL terminal and a diffusion connection of at least one of the read transistors are connected or disconnected based on the storage node voltage.

Optionally, based on the SN voltage (and assuming the DRT has not been exceeded), when a first logic level is retained in the gain cell, the RBL is connected to a gain cell terminal or gain cell node having a voltage level representing the first logic level. When the opposite logic level is retained in the gain cell, the RBL is disconnected from that gain cell terminal or gain cell node.

The specific connections of the read transistors depend on the gain cell implementation. For example, in the 2T gain cell of FIG. 2A, the SN voltage opens and closes a conductive path between RBL and RWL. In a second example, in the 3T gain cell of FIG. 3B the SN voltage opens and closes a conductive path between RBL and ground (GND).

The specific interconnections amongst the transistors forming the gain cell are determined by the type of gain cell being used in a given embodiment. Gain cell types suitable for embodiments of the invention include but are not limited to:

1) 2T gain cell;
2) 3T gain cell;
3) Four-transistor (4T) gain cell; and
4) Six-transistor (6T) gain cell.

Optionally the gain cell transistors include at least one PMOS transistor and at least one NMOS transistor in a single well. In some further embodiments, the PMOS transistor is a regular voltage threshold (RVT) transistor and the NMOS transistor is a low voltage threshold (LVT) transistor, coupled in an n-well (see the embodiment of FIGS. 3A-B). In alternate embodiments, the PMOS transistor is an LVT transistor and the NMOS transistor is an RVT transistor, coupled in a p-well.

The terms RVT and LVT are naming conventions used to distinguish between transistors with respectively higher and lower threshold voltages relative to each other. For example, a lower threshold voltage incurs more leakage currents and is also capable of faster operation, whereas a higher threshold voltage incurs less leakage currents but is slower.

Optionally, the body voltage, $V_{BB}$, is set equal or close to the limits of the permitted bulk voltage in order to improve retention time and read speed of the gain cell. For example, for a gain cell in 28 nm FD-SOI with PMOS RVT (for write) and NMOS LVT (for read) the bulk voltage may be set at or close to 3 volts. In a different example, for an FD-SOI gain cell with NMOS RVT (for write) and PMOS LVT (for read) the bulk voltage may be set at or close to the lowest negative body voltage of −3 volts.

I.B. Readout Circuitry for Body-Biased FD-SOI GC-eDRAM

Optionally readout circuit 130 is connected to gain cell 100 at the RBL terminal. Further optionally, readout circuit 130 includes at least one sense inverter which transforms the signal read out from the gain cell to a data signal. Yet further optionally, readout circuitry 130 includes two sense inverters (a fast sense inverter and a slow sense inverter), which switch at different thresholds and consequently at different speeds. A comparator outputs an error signal when the data output signals from the fast sense inverter and slow sense inverter are different.

It is noted that the term "circuitry" (e.g. the error detection circuitry and/or readout circuitry referred to herein) is not intended to imply that the circuit elements (e.g. transistors, logic gates, etc.) are necessarily located on a separate chip or physical component than the gain cell (or a memory macro which includes the gain cell). Typically the circuit elements are embedded on the same chip as the gain cell itself.

As used herein the term "sense inverter" means a read circuit to which RBL is connected as input and which outputs the digital data in the gain cell being read. Optionally, in a memory macro a respective sense inverter is provided for each column and the sense inverter outputs the digital data in the gain cell being accessed in the column.

As used herein the term "memory macro" means a block containing a memory array and required peripherals for write and read operations and to provide an interface to the external logic. Examples of such peripherals include but are not limited to: write/read decoders, level shifters, output MUX, etc.

Optionally, one or both of the fast sense inverter and the slow sense inverter is enabled and disabled by a respective enable signal.

Figure 7:
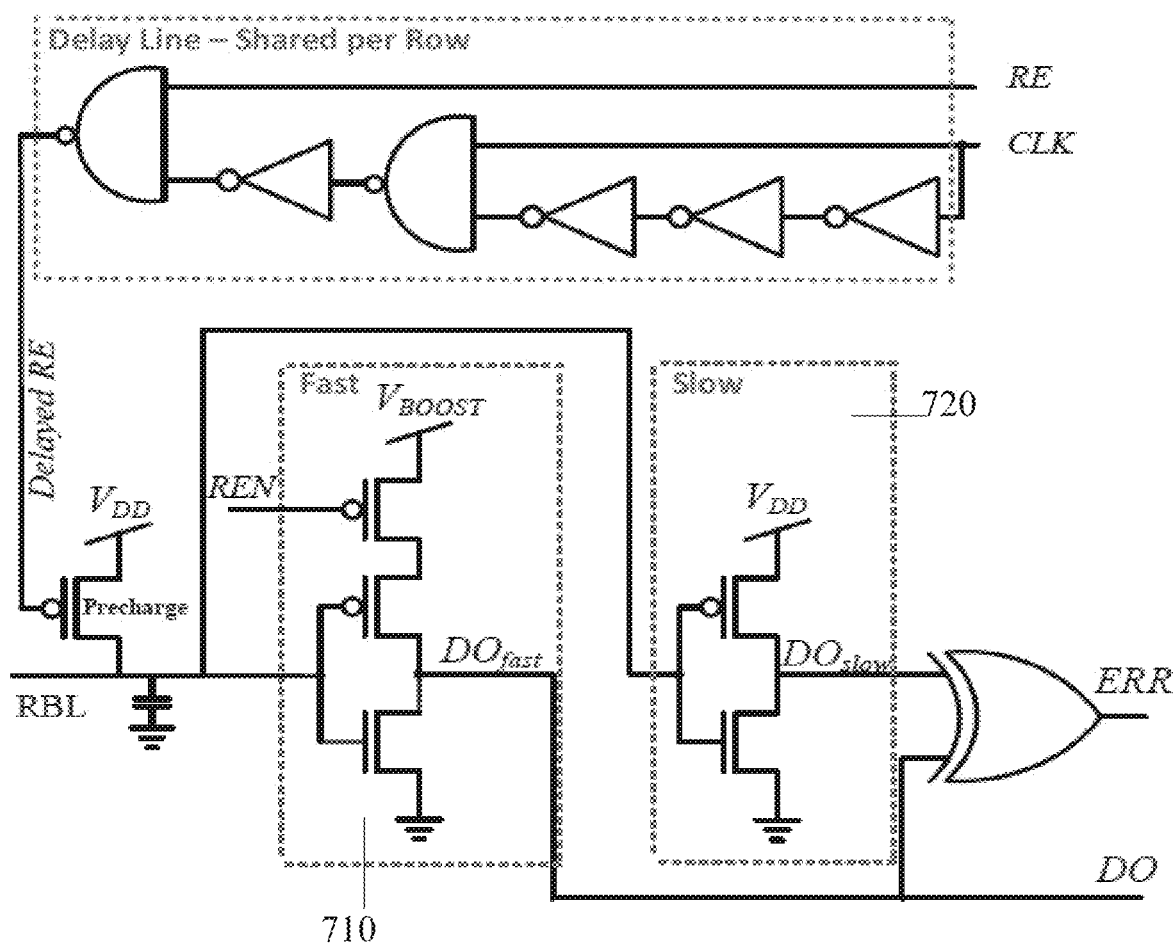
FIG. 7 is a simplified circuit diagram of an error detection circuit, in accordance with exemplary embodiments of the invention.
Figure 12:
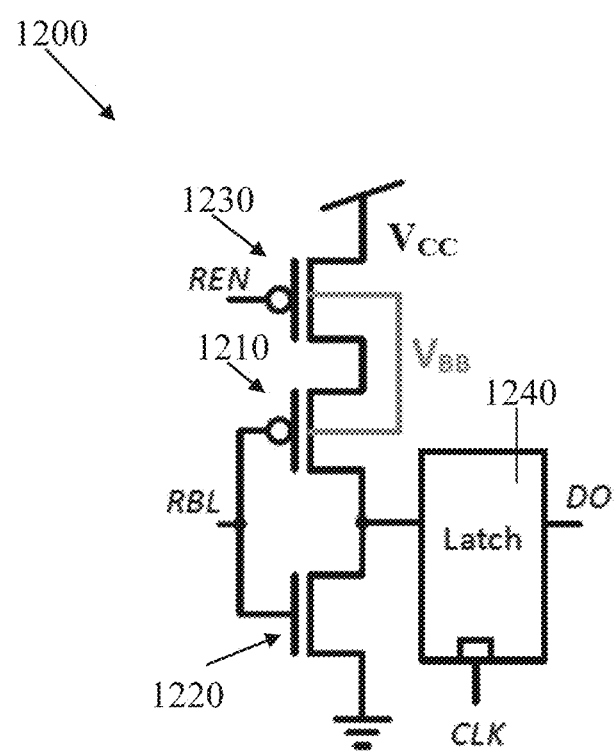

The speeds of the fast and slow sense inverters may be established by any means known in the art. In a first optional embodiment, the fast sense inverter is powered by a boosted supply voltage and the slow sense inverter is powered by a second supply voltage (such as $V_{DD}$), yielding different switching thresholds for the fast sense inverter and the slow sense inverter. Alternately or additionally, the fast sense inverter includes an FD-SOI PMOS transistor and an FD-SOI NMOS transistor, at least one of which is body-biased. The body voltage applied to the fast sense inverter may be adjustable during gain cell operation. Exemplary embodiments are shown in FIGS. 7 and 12 and described in more detail below.

I.C. 2T FD-SOI GC-eDRAM with Body-Biasing

Figure 2A:
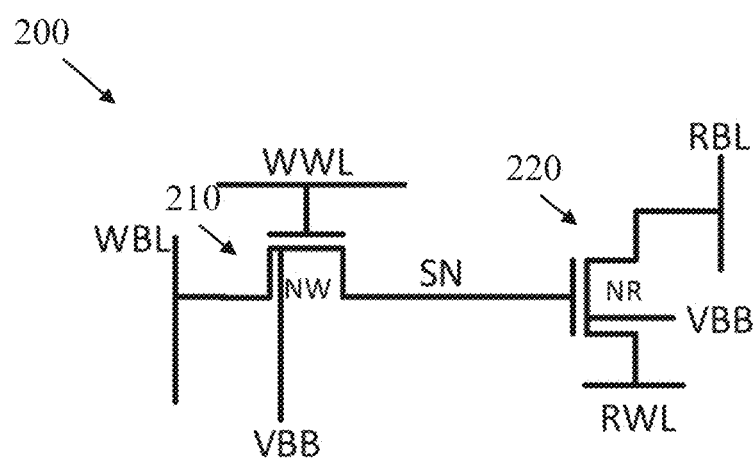
FIGS. 2A-2C are simplified block diagrams of 2T FD-SOI gain cells, according to respective exemplary embodiments of the invention.

Reference is now made to FIG. 2A, which is a simplified block diagram of a 2T FD-SOI gain cell according to a first exemplary embodiment of the invention. Gain cell 200 includes two NMOS transistors, write transistor NW 210 and read transistor NR 220. The bulk connections of both write transistor NW 210 and read transistor NR 220 are connected to the same body voltage VBB. Both NW 210 and read transistor NR 220 are RVT transistors. This configuration offers low power consumption through the use of RVT devices, but reduced access speed.

Figure 2B:
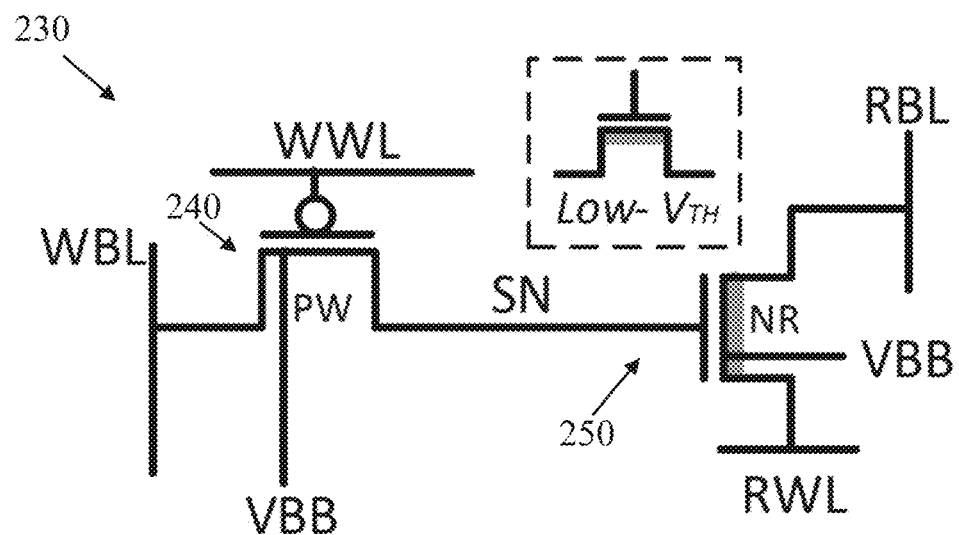

Reference is now made to FIG. 2B, which is a simplified block diagram of a 2T FD-SOI gain cell according to a second exemplary embodiment of the invention. Gain cell 230 includes PMOS write transistor PW 240 and NMOS read transistor NR 250. PW 240 is an RVT transistor and NR 250 is an LVT transistor. The bulk connections of both write transistor PW 210 and read transistor NR 220 are connected to the same body voltage VBB. The ability to connect NMOS and PMOS transistors to the same body voltage is a unique feature of FD-SOI technology. This configuration offers low leakage from the storage node (hence a high retention time) at the cost of slow write access time, and a fast read access speed at the cost of increased leakage through read transistor NR 250.

Figure 2C:
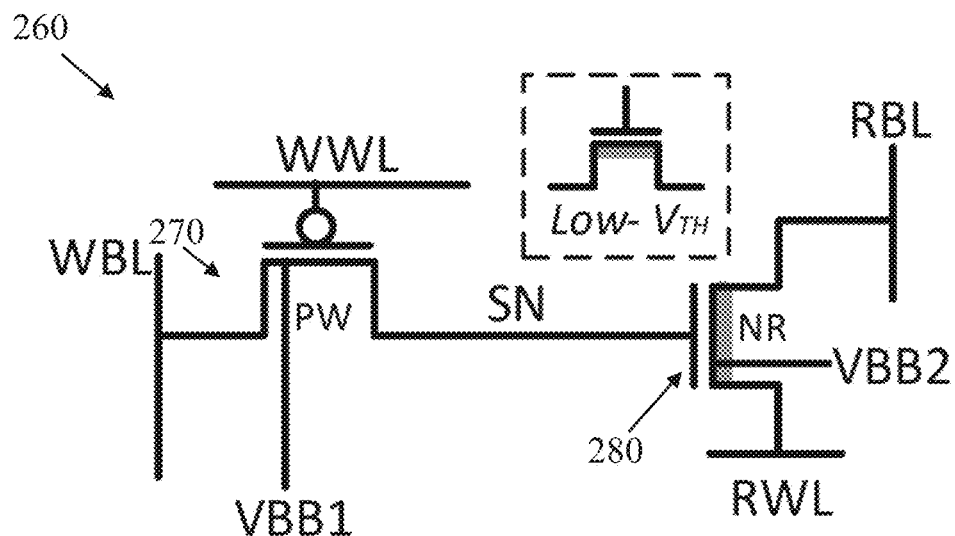

Reference is now made to FIG. 2C which is a simplified block diagram of a 2T FD-SOI gain cell according to a third exemplary embodiment of the invention. Gain cell 260 includes PMOS write transistor PW 270 and NMOS read transistor NR 280. PW 270 is an RVT transistor and NR 280 is an LVT transistor. The bulk connections of write transistor PW 270 and read transistor NR 280 are connected to different respective body voltages, VBB1 and VBB2. Using this configuration, different body voltages may be applied to each transistor, offering the opportunity for more optimizations which trade-off power and speed. However it incurs an additional overhead required to provide the two body voltages.

I.D. 3T FD-SOI GC-eDRAM with Body-Biasing

Similarly to the 2T FD-SOI gain cell, 3T FD-SOI gain cells may be formed with different combinations of PMOS and NMOS transistors. Additionally or alternatively, the 3T gain cell includes transistors with different voltage thresholds.

Figure 3A:
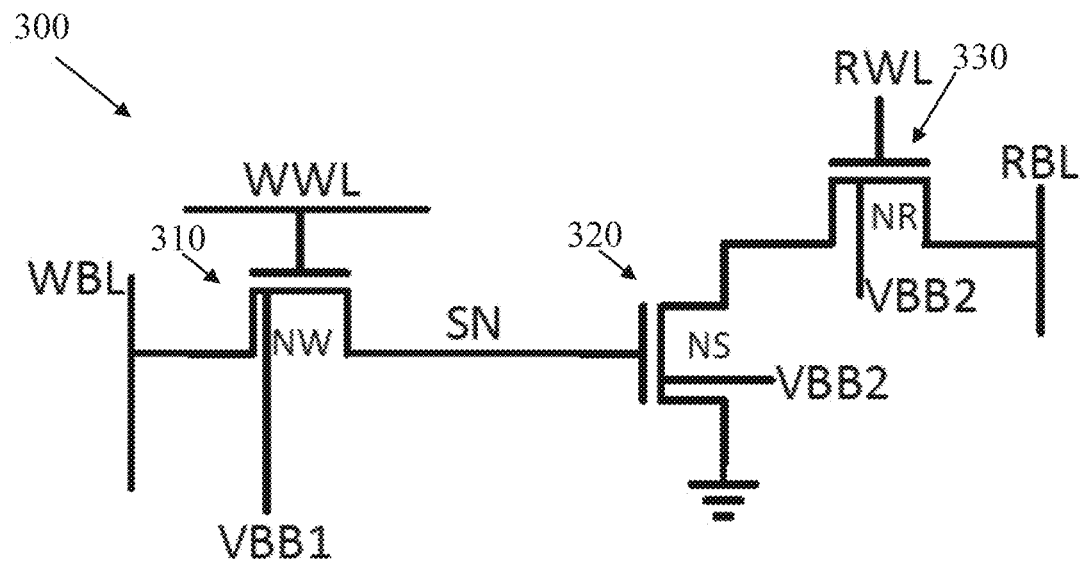
FIGS. 3A-3B are simplified circuit diagrams of 3T FD-SOI gain-cells, according to respective exemplary embodiments of the invention.
Figure 3B:
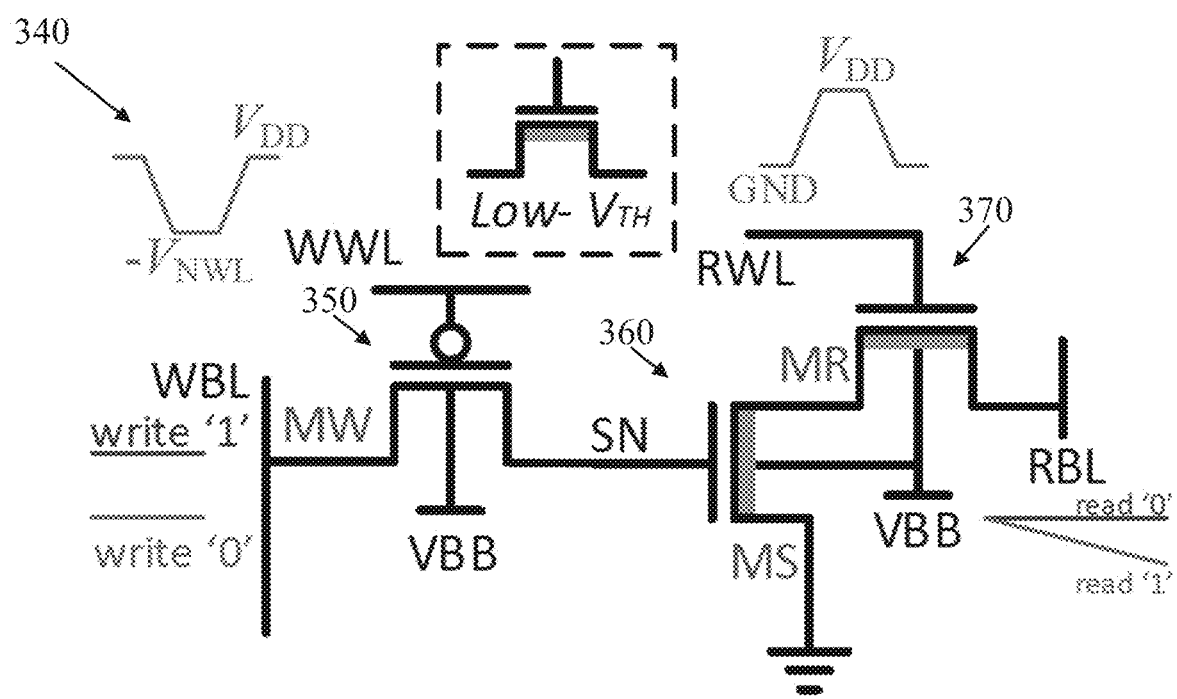

Reference is now made to FIGS. 3A-3B, which are simplified circuit diagrams of a 3T FD-SOI_gain-cell according to respective exemplary embodiments of the invention.

In FIG. 3A, 3T FD-SOI gain cell 300 includes three NMOS transistors: write transistor (NW 310) and read transistors (NS 320 and NR 330). All three transistors are RVT transistors, however they are not all connected to the same body voltage. NW 310 is body biased at VBB1 whereas NS 320 and NR 330 are body biased at VBB2. The use of separate body voltages may be useful, for example, to increase the data retention time by suppressing the leakage through NW 310 with a decreased VBB1 while also reducing the read access time by increasing the ON current through NR 330 with an increased VBB2.

In FIG. 3B, 3T FD-SOI gain cell 340 includes a regular voltage threshold (RVT) PMOS write transistor (MW 350) and two low voltage threshold (LVT) NMOS read transistors (MS 360 and MR 370). MW 350, MS 360 and MR 370 are implemented in a single n-well at a body voltage of VBB. Even though all three transistors are connected to the same body voltage, MW 350 may operate in reverse back bias (RBB) mode to reduce sub-voltage threshold leakage, while MS 360 and MR 370 are in forward back bias (FBB) mode to improve read access. FIG. 3B also illustrates waveforms for write and read ($V_{DD}/-V_{NWL}/V_{DD}$ for write and GND/$V_{DD}$/GND for read).

Figure 4A:
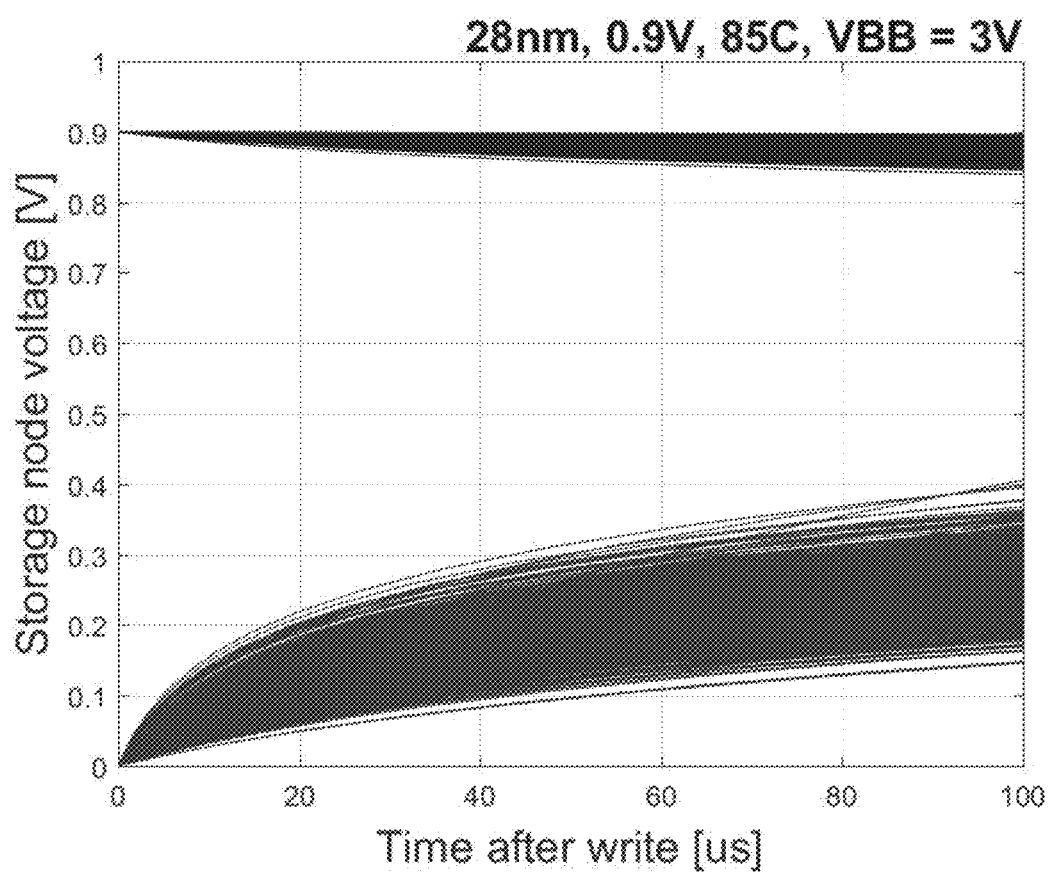
FIGS. 4A-4B show data degradation curves for a 3T FD-SOI gain-cell with and without reversed body bias respectively.
Figure 4B:
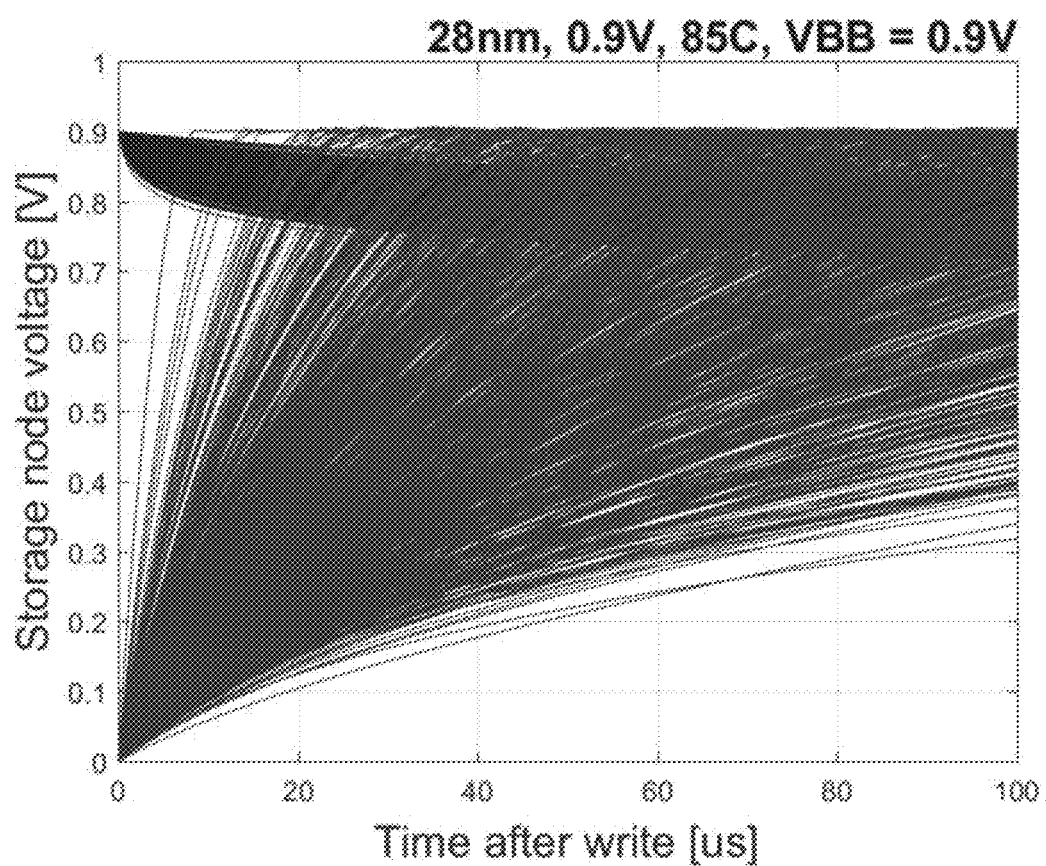

By increasing the body voltage (VBB) of the n-well, MW 350 enters a reversed-body bias regime resulting in reduced leakage and extended DRT. This is demonstrated by FIGS. 4A-4B, which show data degradation curves with and without reversed body bias respectively. The degradation of logic levels '1' and '0', with WBL driven to the opposite voltage to maximize the leakage from SN, was extracted from 1K Monte-Carlo simulations including mismatch and process variations. The resulting waveforms clearly indicate the advantage of body biasing. FIG. 4A shows the data levels degrading much slower with a 3V VBB bias, as compared to FIG. 4B which illustrates the results when VBB is kept at $V_{DD}$ (0.9 V).

Figure 5:
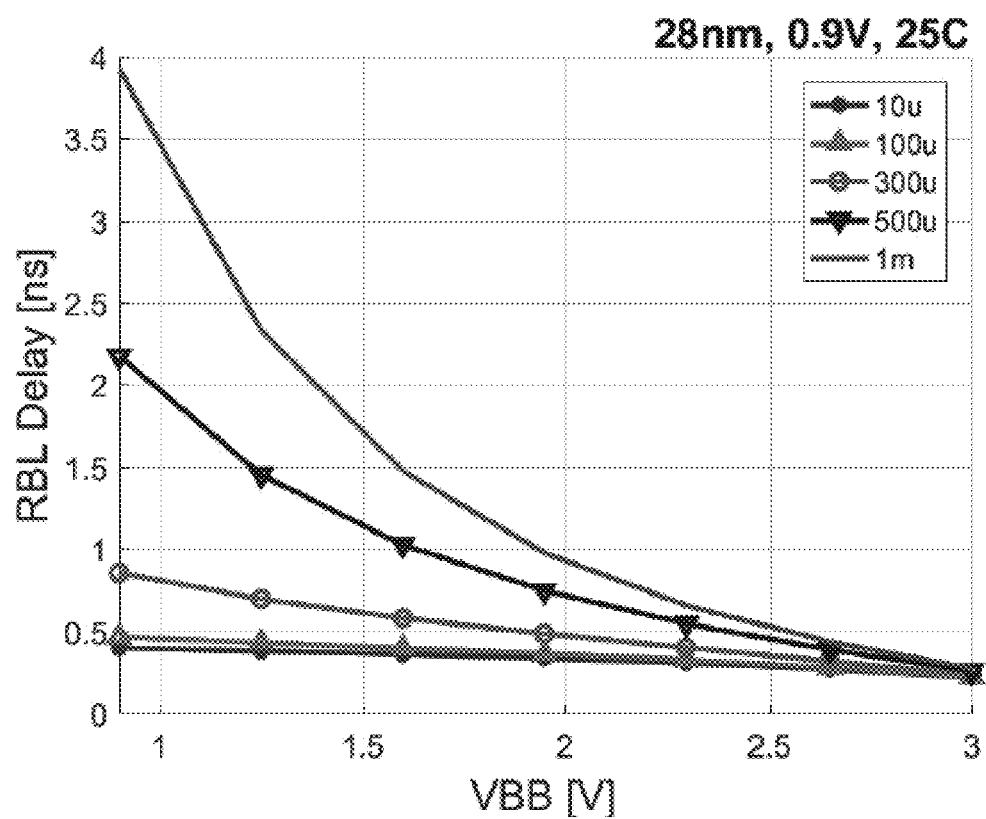
FIG. 5 shows RBL discharge delay for a 3T FD-SOI gain-cell under different forward body voltages.

Moreover, the increase in VBB puts LVT NMOS transistors (MS 360 and MR 370) in a forward body bias regime, resulting in a higher discharge current of RBL during readout when the cell holds '1'. FIG. 5 shows the RBL discharge delay under different forward bias VBB voltages at different times after write '1'. As the time after write increases, the data in the cell becomes increasingly degraded, resulting in a longer RBL discharge latency due to reduced overdrive of MS 360. With forward body biasing, the discharge latency is reduced up-to eight times across the VBB range. The reduced discharge latency extends the DRT for a given read frequency and enables the integration of more cells in a column (which incurs higher RBL capacitance). The RBL discharge delay was defined as the time it takes the RBL to discharge to 0.5 $V_{DD}$ and the capacitance was extracted from layout for a 256-row memory array.

In alternate embodiments, the body-biased 3T FD-SOI bitcell includes LVT PMOS and RVT NMOS transistors in a single p-well.

I.E. Body-Biased 3T Memory Macro

Figure 6:
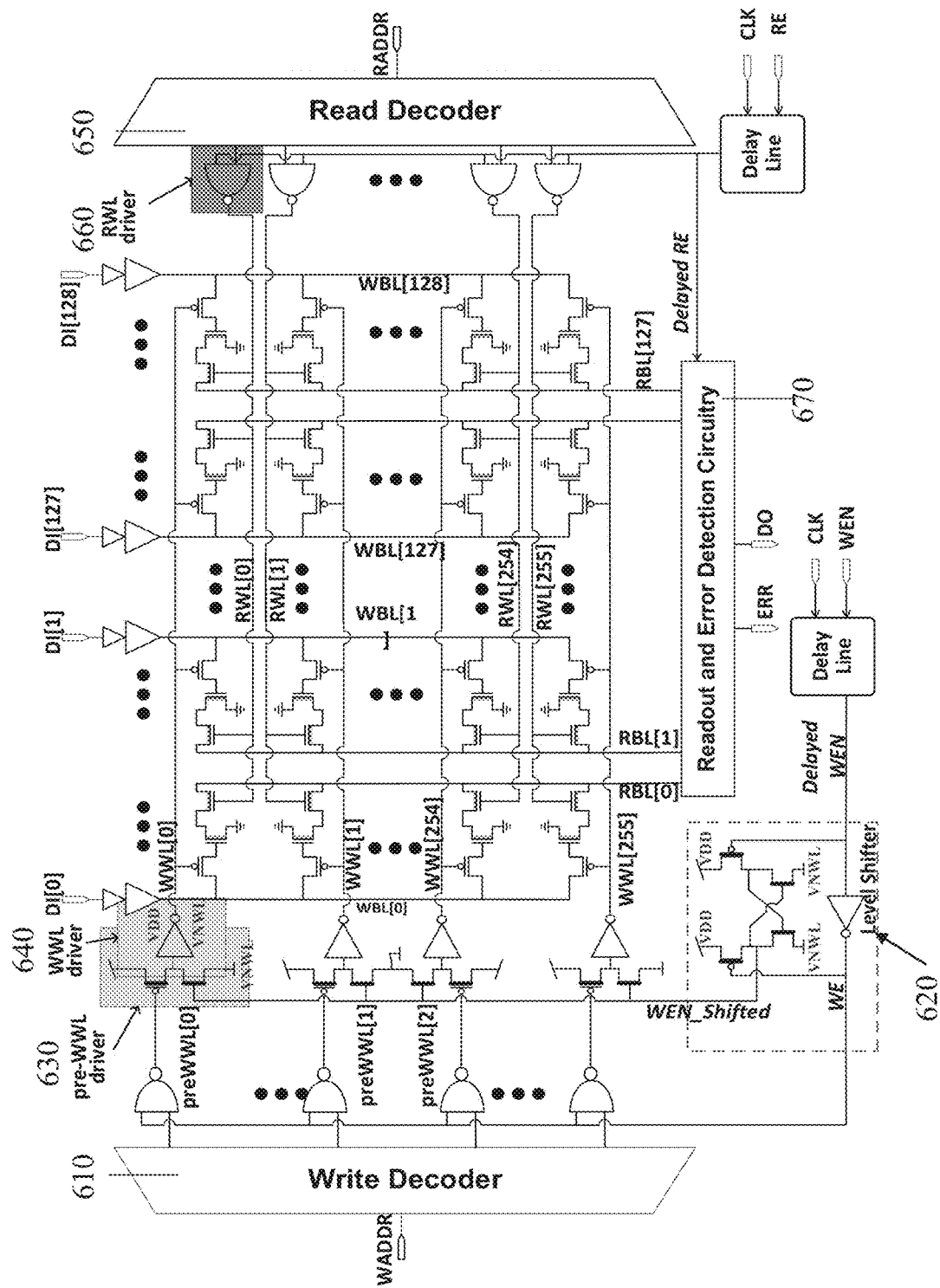
FIG. 6 is a simplified diagram of the architecture of a 32 kb GC-eDRAM memory macro, according to exemplary embodiments of the invention.

Reference is now made to FIG. 6, which is a simplified diagram of the architecture of a 32 kb (256×128) GC-eDRAM memory macro, according to exemplary embodiments of the invention. The memory macro includes an array of 3T gain-cells 340 (as in FIG. 3B). For write, the WWL of the selected row is discharged to a negative voltage (VNEG) to overcome the VT drop when writing '0' through a PMOS device. During read, the RBL is precharged to $V_{DD}$ and RWL of the selected row is charged, conditionally discharging RBL if the cell holds '1'.

The write port consists of write decoder 610, level-shifter 620, pre-WWL driver 630, and WWL drivers 640. Both the pre-WWL and WWL drivers are implemented with thick-oxide I/O devices to avoid oxide breakdown. The structure of the pre-WWL drivers limits the negative signals in the array to the selected WWL and the negative inverted write enable (WEN_Shifted) net, driven by global level shifter 620. The inverted write enable (WEN) signal discharges WEN_Shifted to cut off the pull-down path of the pre-WWL drivers, while enabling the pull-up path of the selected pre-WWL driver. This toggles the selected WWL driver to assert WWL and transfer the Data In (DI) inputs to the SNs of the selected row.

The read port consists of a read decoder 650, RWL drivers 660, RBL precharge devices and readout and error detection circuitry 670. When the read enable (RE) input is low, all RBLs are precharged to $V_{DD}$. The rising-edge of RE cuts off the RBL precharge and simultaneously drives the selected RWL low. A stored '1' causes RBL to discharge through the RWL driver, while RBL stays high for a '0'. Optionally, readout circuitry 670 includes at least one sense inverter. Further optionally, in order to obtain error detection capabilities two sense inverters are integrated into the array by readout circuitry 670.

Reference is now made to FIG. 7, which is a simplified circuit diagram of an error detection circuit in accordance with exemplary embodiments of the invention. The 'fast' sense inverter 710 is supplied by a boosted voltage ($V_{BOOST}$) to increase its switching threshold and enable faster switching during RBL discharge. Boosted supplies are typically used in GC-eDRAM arrays to bias the WWL during standby in order to further reduce the sub-threshold leakage. Static power dissipation is avoided by gating the boosted supply with a PMOS transistor, biased by a shifted REN enable signal. The 'slow' sense inverter 720 is biased by the main supply ($V_{DD}$) and requires a lower RBL voltage to switch. The delay lines may be used to allow all the WWLs and RWLs to "reset" (e.g. discharge to GND) before evaluation of the updated address for write/read.

Figure 8A:
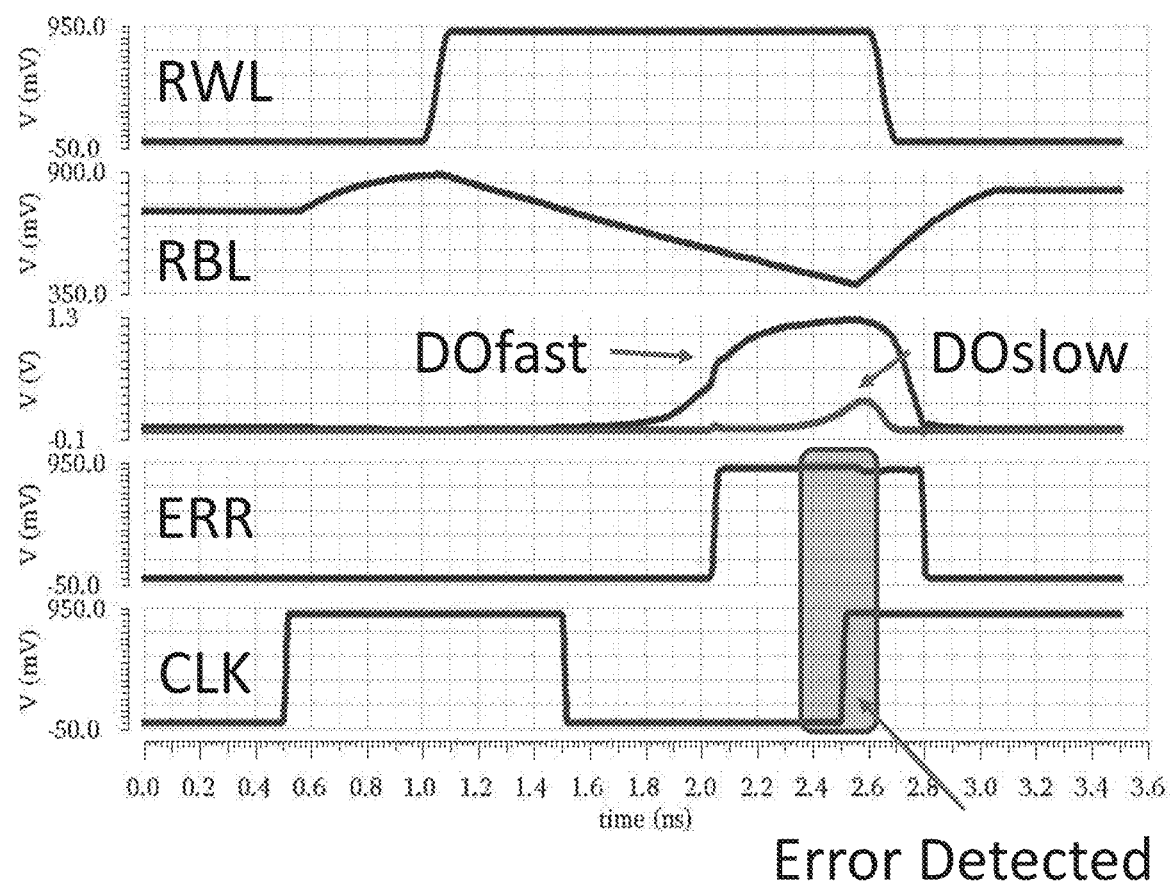
FIGS. 8A-8B demonstrate error detection by an error detection circuit.
Figure 8B:
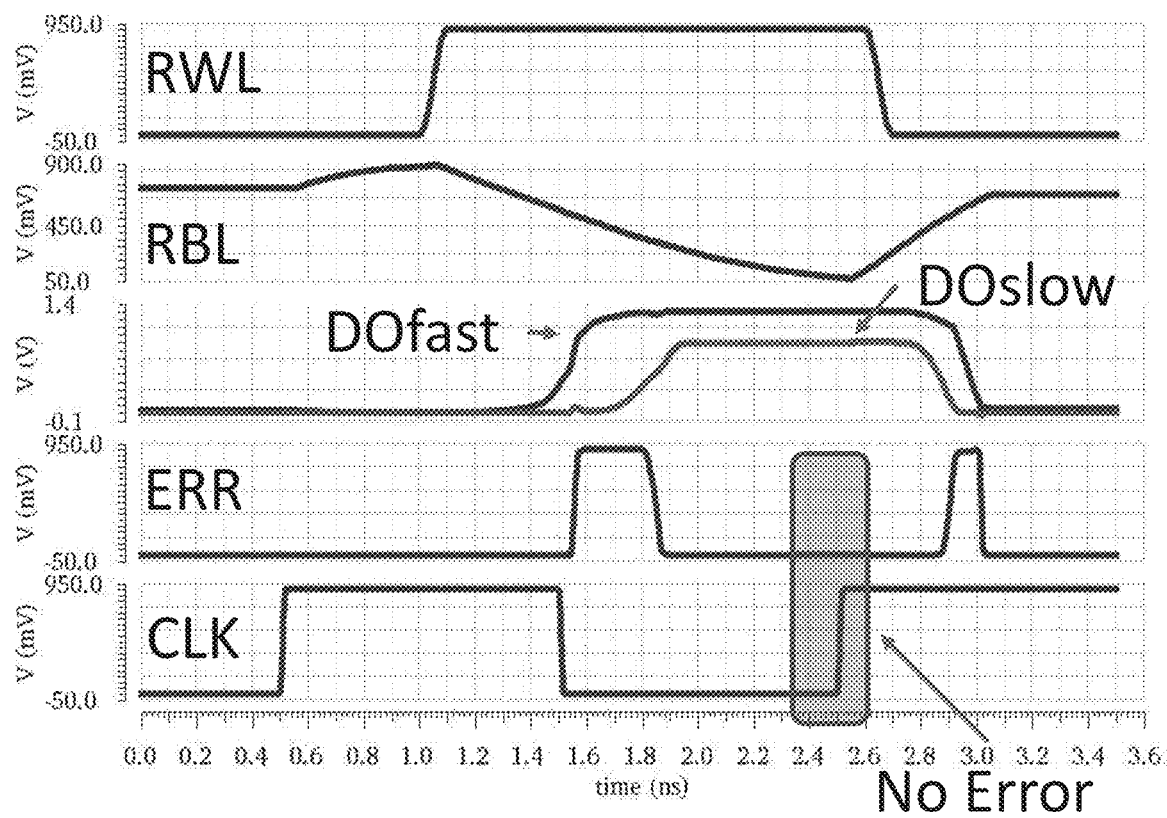

The difference between the switching times may be used as an error detection window. If the rising clock edge samples the data during this window it may be deduced that an error (ERR) has occurred, as shown in FIGS. 8A-8B. The correct data is still available at the output of the fast sense inverter (thus not incurring CPU stalls); however the error detection may be used to significantly reduce the large design margins that are taken to guarantee reliable operation under process-voltage-temperature (PVT) variations. For example, voltage scaling and refresh time may be adjusted after fabrication by following the ERR signals during read-out.

Figure 9:
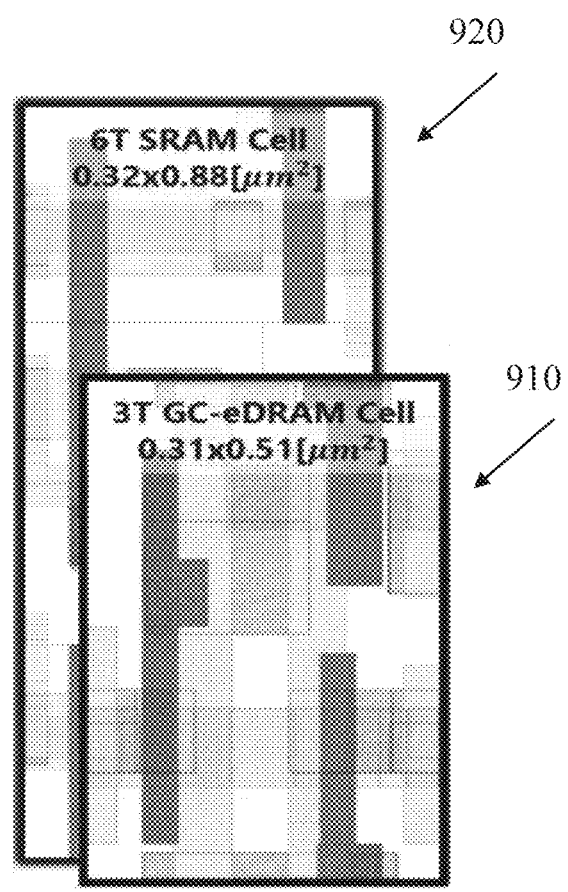
FIG. 9 shows a layout view of a 32 kb eDRAM memory macro, according to an exemplary embodiment of the invention.

FIG. 9 shows a layout views of the 3T FD-SOI gain-cell presented herein and a 6T SRAM cell. Both cells were implemented in 28 nm FD-SOI technology. 3T gain cell 910 measures 0.31 µm by 0.51 µm, and features minimum sized devices for MS and MR and a slightly upsized channel length for MW to reduce subthreshold leakage current (ISUB). The size of the 3T gain cell is only 54% of the size of a redrawn 6T SRAM gain cell 920 in the same technology (which measures 0.32 µm by 0.88 µm). A memory macro based on an array of 3T FD-SOI gain-cells has a silicon footprint of 80 µm by 92 µm, which is 44% smaller than a compiled 6T SRAM memory macro of the same size with "pushed" design-rules.

II. Method of Storing Data in an FD-SOI GC-eDRAM with Body-Biasing

Figure 10:
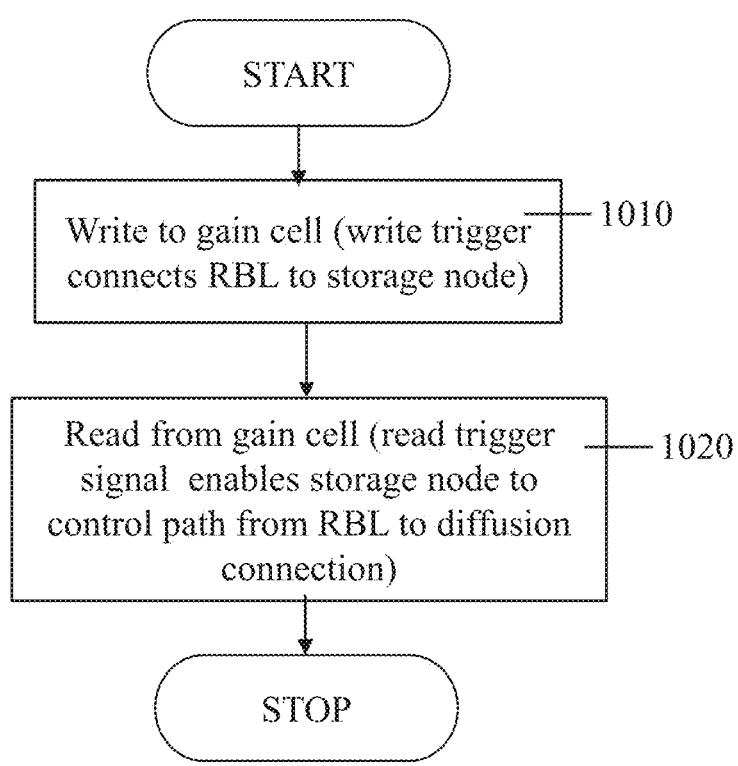
FIG. 10 is a simplified flowchart of a method of storing data in a gain cell, according to embodiments of the invention.

Reference is now made to FIG. 10, which is a simplified flowchart of a method of storing data in a gain cell, according to embodiments of the invention. The gain cell may be any type of body-biased FD-SOI gain cell as described herein. The FD-SOI transistors forming the gain cell include at least one write transistor having a gate connected to the write trigger terminal and at least one read transistor having a gate connected to the storage node. At least two of the FD-SOI transistors have bodies coupled in a single well to a body voltage terminal In 1010, data is written to the gain cell when a write operation is triggered by the write trigger signal. The write trigger signal controls a write transistor so that the WBL terminal and the storage node are connected via the write transistor when a write operation is triggered.

In 1020, data is read from the gain cell when a read operation is triggered by the read trigger signal. The storage node voltage connects and disconnects the read bit line terminal from a diffusion connection of one of the read transistors, so that the voltage level corresponding to the data stored in the gain cell is output at the read bit line terminal.

Optionally, the read transistor diffusion connection is connected directly to a supply voltage (or ground). Alternately, the appropriate voltage level is provided to the read transistor diffusion connection when it is connected to the read bit line terminal, for example by connecting the read transistor diffusion connection to RWL. When the opposite logic level is stored in the gain cell, the read bit line terminal and read transistor diffusion connection are disconnected.

III. Body-Bias Compensated Readout and Error Detection

Body-biasing may also improve the performance of readout circuitry which processes the signals read out from a gain cell or memory macro.

III.A. Body-Biased Sense Inverter

Figure 11A:
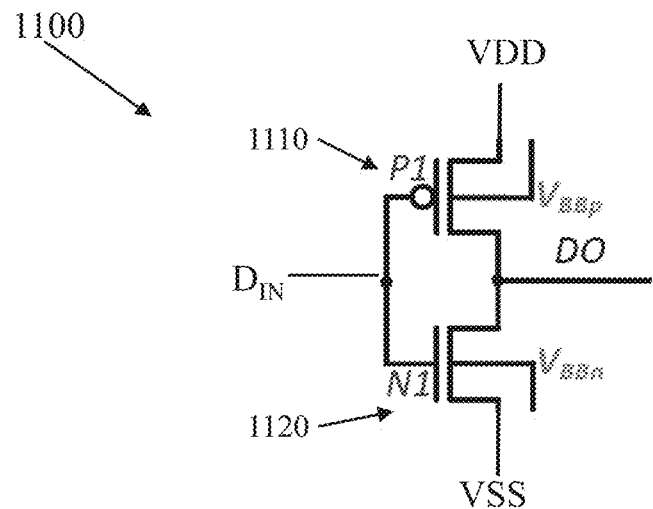
FIGS. 11A-B and 12 are simplified circuit diagrams of a body-biased sense inverter, according to respective exemplary embodiments of the invention.

Reference is now made to FIG. 11A, which is a simplified circuit diagram of a body-biased sense inverter according to embodiments of the invention. Sense inverter 1100 is implemented in FD-SOI, optionally in 28 nm FD-SOI.

Optionally, sense inverter 1100 is a component of readout circuitry of an FD-SOI GC-eDRAM. Further optionally, sense inverter 1100 is a component of readout circuitry of a body-biased FD-SOI GC-eDRAM as described above.

Sense inverter 1100 includes:
 a) Input terminal $D_{IN}$ for receiving the signal read out of a gain cell;
 b) Data output terminal DO for outputting the data level detected by sense inverter 1100;
 c) FD-SOI PMOS transistor P1 1110; and
 d) FD-SOI NMOS N1 1120.

One or both of P1 1110 and N1 1120 is connected to a body voltage, $V_{BBp}$ and $V_{BBn}$ respectively. The gate connections of the P1 1110 and NMOS transistor 1120 are connected to input terminal $D_{IN}$. Optionally $D_{IN}$ is connected to a read bit line (e.g. the RBL of a gain cell or of a memory macro including multiple gain cells). Diffusion connections of P1 1110 and N1 1120 are connected to data output terminal DO.

Figure 11B:
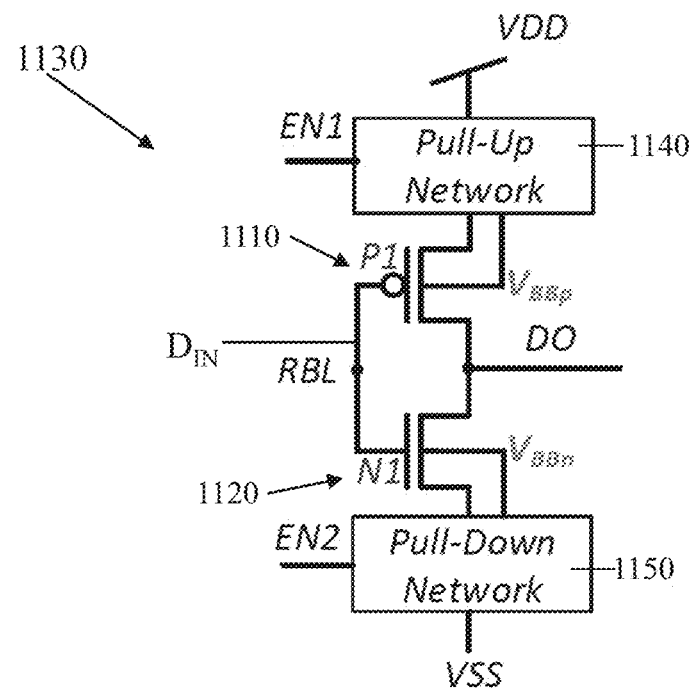

Optionally, P1's second diffusion connection is connected to the high voltage source ($V_{DD}$) either directly (as shown in FIG. 11A) or indirectly (e.g. through a pull-up network or a single transistor as shown in FIGS. 11B and 12 respectively). Alternately, P1's second diffusion connection is connected to a boosted voltage ($V_{BOOST}$), either directly or indirectly. N1's second diffusion connection is connected to the low voltage source (VSS or ground) either directly (as illustrated in FIG. 11A) or indirectly (e.g. through a pull-down network as illustrated in FIG. 11B).

In some embodiments only one of the transistors is connected indirectly to its supply voltage whereas the other transistor is connected directly to its supply voltage. In FIG. 12, for example, PMOS transistor 1210 is connected to the supply voltage indirectly through transistor 1230 whereas NMOS transistor 1220 is connected directly to ground.

Optionally, sense inverter 1100 includes a latch which latches the sensed data signal in accordance with a clock signal, in order to maintain the level of the data signal at data output DO.

Reference is now made to FIG. 11B, which is a simplified circuit diagram of a body-biased sense inverter according to an exemplary embodiment of the invention. Sense inverter 1130 has both pull-up network 1140 and pull-down network 1150. Each of networks is enabled by a respective enable signal, EN1 or EN2. Optionally, EN1 and EN2 are connected and the same signal serves to enable and disable both networks. Disabling the networks may be used to limit the static power dissipation through the sense inverters when the array is not accessed for read (e.g. during inactive cycles).

Reference is now made to FIG. 12, which is a simplified circuit diagram of a body-biased sense inverter according to exemplary embodiments of the invention. Sense inverter 1200 includes PMOS transistor 1210 and NMOS transistor 1220 connected as shown, with a second PMOS transistor 1230 serving as a pull-up network to $V_{CC}$ (e.g. $V_{DD}$ or $V_{BOOST}$) and enabled by REN.

Optionally, PMOS transistor 1230 connects and disconnects PMOS transistor 1210 from high voltage $V_{DD}$. Alternately, PMOS transistor 1230 connects and disconnects PMOS transistor 1210 from boosted voltage $V_{BOOST}$.

The bulk connections of PMOS transistors 1210 and 1230 are connected to body voltage $V_{BB}$. The improved performance obtained by body-biasing the PMOS transistors is demonstrated below.

Optionally, NMOS transistor 1220 is also body-biased, either by the same $V_{BB}$ or by a different body voltage.

Optionally, at least one body voltage is dynamically adjusted during operation of the body-biased sense inverter based on feedback parameters such as temperature, process variations, voltage variations, operating frequency, target retention time and/or other considerations such as required performance, power usage etc.

Optionally, sense inverter 1200 includes or is connected to body-bias supply (not shown) which provides at least one body voltages. Further optionally, the level of the body-bias supply is set by a control signal. Varying the control signal during operation changes the body voltage(s) and may be used to obtain improved performance of the sense inverter under varying operating conditions.

Optionally, sense inverter 1200 includes latch 1240 which latches the signal at the junction of the diffusion connections of PMOS transistor 1210 and NMOS transistor 1220 in accordance with clock signal CLK.

Optionally, sense inverter 1200 is part of error detection circuitry which includes two sense inverters with different thresholds. $V_{BB}$, and optionally $V_{BOOST}$, are established at levels which cause relatively fast triggering by sense inverter 1200. If the second sense inverter is connected to a body voltage and/or a boosted voltage, these are adjusted to cause relatively slow triggering by the second sense inverter.

Figure 13:
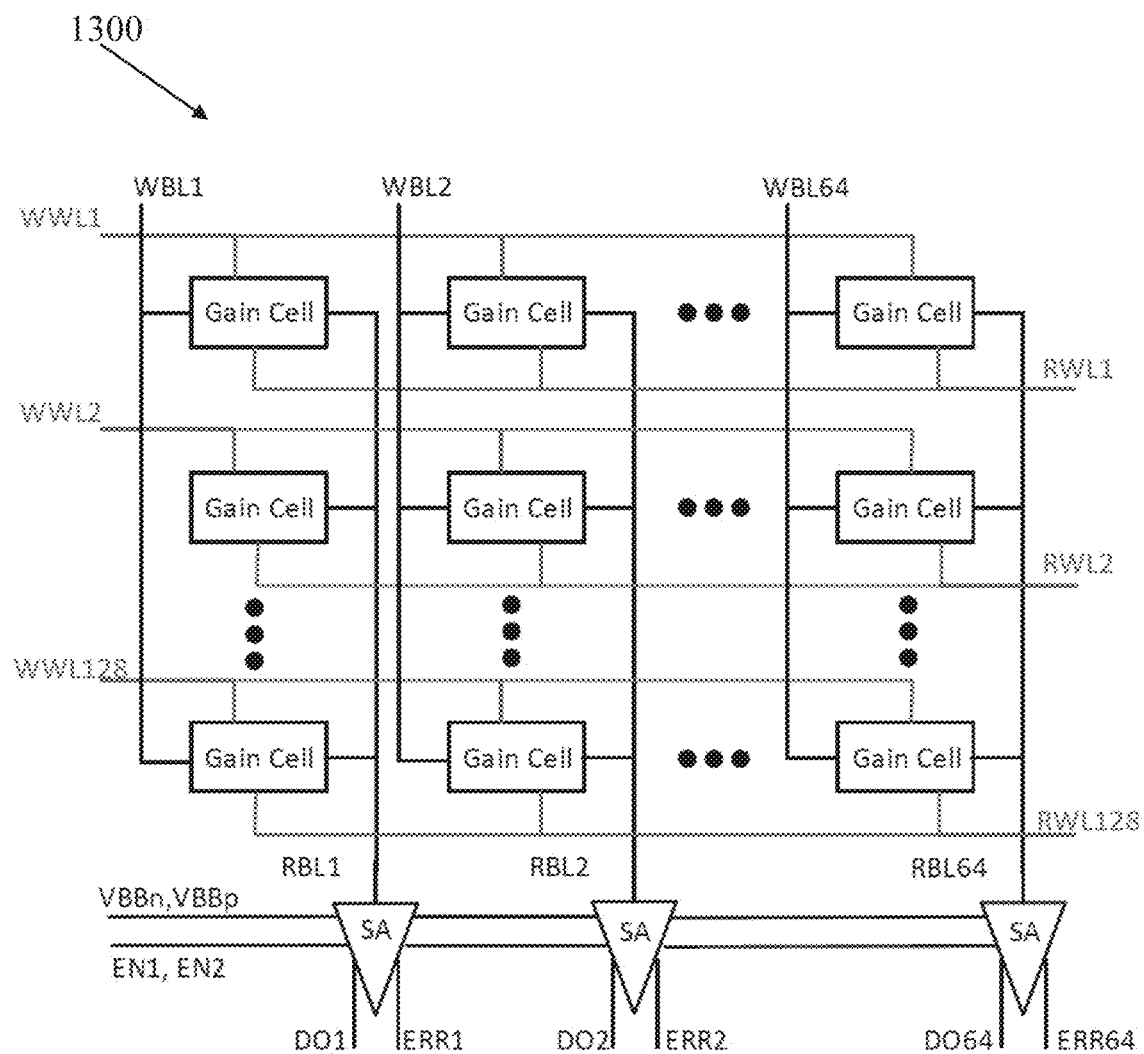
FIG. 13 is a simplified diagram of a memory macro with body-bias compensated readout and error detection, according to embodiments of the invention.

Reference is now made to FIG. 13, which is a simplified diagram of a memory macro with body-bias compensated readout and error detection, according to an exemplary embodiment of the invention. Memory macro 1300 includes a 128×64 array of FD-SOI gain cells. The gain cells may be of any type known in the art, including but not limited to:
1) 2T gain cell;
2) 3T gain cell;
3) Four-transistor (4T) gain cell; and
4) Six-transistor (6T) gain cell.

The RBL of each column of gain cells is connected to respective error detection circuitry (SA), which outputs a data output signal and an error signal indicating whether an error has been detected.

At least one SA includes a body-biased sense inverter (e.g. as illustrated in FIG. 12). In the exemplary embodiment of FIG. 13, all of the SA's include at least one body-biased sense inverter and at least one body voltage ($V_{BBn}$ and/or $V_{BBp}$) is supplied to each SA. Optionally, at least one enable signal (EN1 and/or EN2) is supplied to each SA.

III.B. Exemplary FD-SOI GC-eDRAM with Body-Bias Compensated Readout and Error Detection Results are now presented for a 4T FD-SOI GC-eDRAM bitcell with body-biased compensated readout and error detection. The 4T bitcell includes internal feedback which results in significantly higher DRT than the 2T bitcell at deeply scaled technology nodes.

The RBL output of the 4T GC-eDRAM is connected to the input terminal of a body-biased sense inverter. Dual-sampling for error detection is provided by including a second sense inverter without body-bias ($V_{BB}=V_{BOOST}$) in parallel to the regular readout path.

III.B.1. Retention Time of 4T GC-eDRAM

Figure 14:
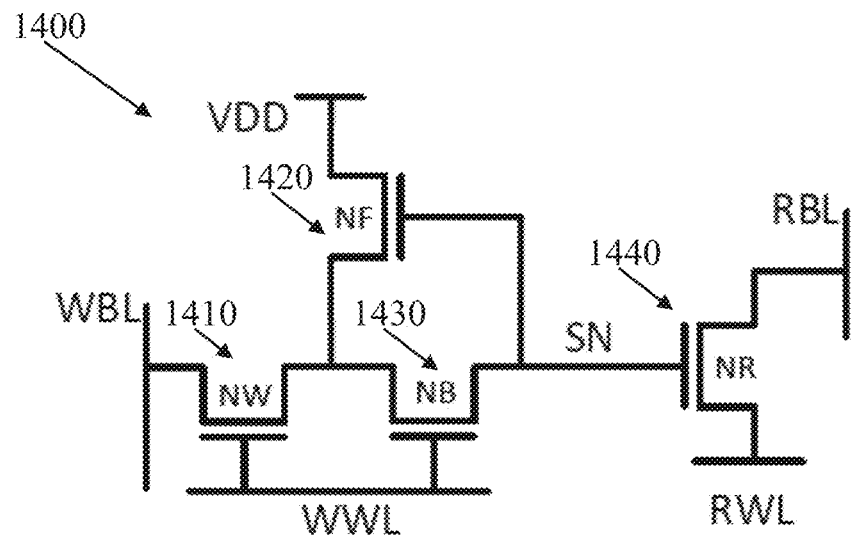
FIG. 14 is a simplified circuit diagram of a 4T GC-eDRAM.

Reference is now made to FIG. 14, which is a simplified circuit diagram of an all-NMOS 4T GC-eDRAM. 4T GC-eDRAM gain cell 1400 includes a write port, including a write bitline (WBL), a write word-line (WWL), and write transistor (NW) 1410; a feedback loop, composed of transistors NF 1420 and NB 1430; a read port, composed of a read bit-line (RBL), a read wordline (RWL) and a read transistor (NR) 1440. Data is stored on the parasitic capacitance of the storage node (SN), and deteriorates over time due to leakage.

Figure 15:
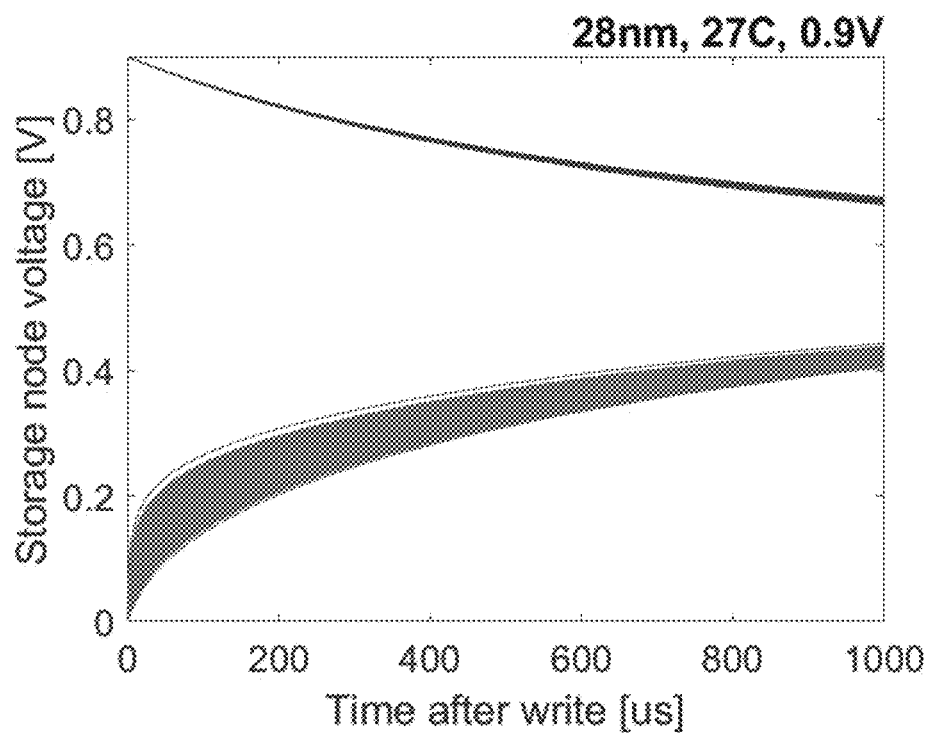
FIG. 15 shows data deterioration curves for the 4T GC-eDRAM.

FIG. 15 shows the data deterioration curves as extracted from 1000 Monte-Carlo (MC) simulations including mismatch and process variations under worst case biasing conditions, which occur when the WBL is biased to the opposite voltage of that stored on the SN. The DRT of the cell is determined by the time after write at which a read failure occurs. A read operation is performed by pre-charging the RBL to $V_{DD}$ and discharging the RWL of the selected row to GND. As a result, the RBL discharges when the cell holds a '1', or it remains charged close to $V_{DD}$ when the cell holds a '0'.

A successful read operation depends on the RBL discharge rate, the switching threshold of the sense inverter ($V_{SW}$), and the data sampling time which is determined by the clock frequency. The array outputs a '1' when the RBL discharges past $V_{SW}$ during the given read cycle, and otherwise outputs a '0'. However, the RBL discharge rate depends on the degraded SN voltage, which significantly fluctuates due to process and temperature variations. Furthermore, the operating frequency sets the amount of time for RBL discharge, and therefore also impacts the DRT. For short cycle times, the RBL voltage of a stored '1' must discharge fast enough to reach beneath the threshold of the sense inverter before the latching of the data, set by the clock frequency. On the other hand, for long cycle times, the RBL voltage for a stored '0' must remain above the switching threshold until the end of the read cycle. These requirements lead to a limited sampling window to achieve a correct readout for all cases.

Figure 16:
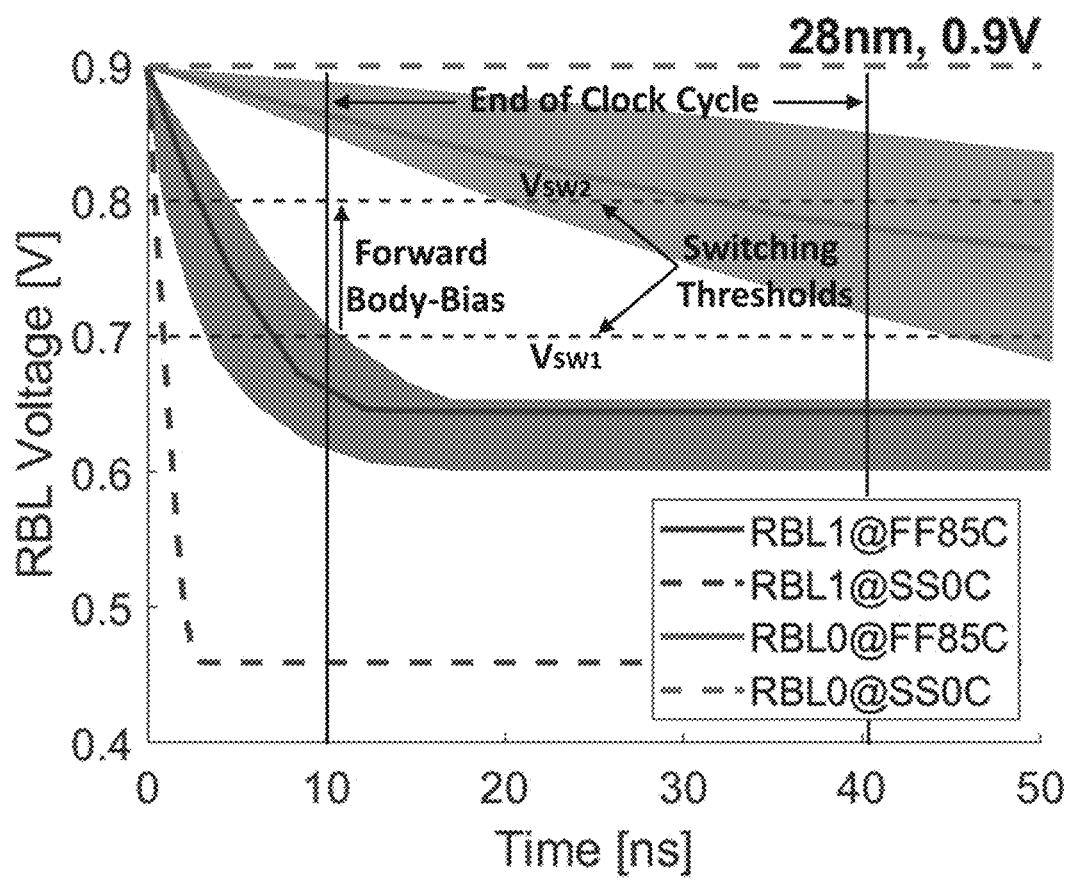
FIG. 16 shows RBL voltages during a read access for data '1' and '0' simulated at Fast-Fast (FF) and Slow-Slow (SS) process corners at 85° C. and 0° C.

FIG. 16 shows RBL voltages during a read access for data '1' (RBL1) and '0' (RBL0), simulated at Fast-Fast (FF) and Slow-Slow (SS) process corners at 85° C. and 0° C., with shaded areas illustrating the effect of local variations. While the RBL voltages for '1' and '0' may be clearly distinguished under SS0 due to low leakage from the cell (which retains "strong" data levels), their difference is reduced under FF85 and local variations. Consequently, $V_{SW}$ should be carefully adjusted for each process corner according to the target frequency ($V_{SW1}$ and $V_{SW2}$ for 40 ns and 10 ns cycle times, respectively), otherwise resulting in read failures.

III.B.2. Integration of Body-Biasing and Dual-Sampling for Error Detection

To support dynamic adjustment of $V_{SW}$, the effective body biasing capability of FD-SOI is utilized by connecting the n-well of the PMOS devices to $V_{BB}$. This enables applying a body-bias to increase $V_{SW}$ under high frequency demands and extreme operating conditions. The read access delay is further reduced by supplying the sense inverter with a boosted voltage ($V_{BOOST}$), typically available on the chip for the write assist. The modified sense inverter contains an additional powergate device, driven by a boosted read enable signal (REN) to avoid the dissipation of short-circuit power during standby.

Figure 17:
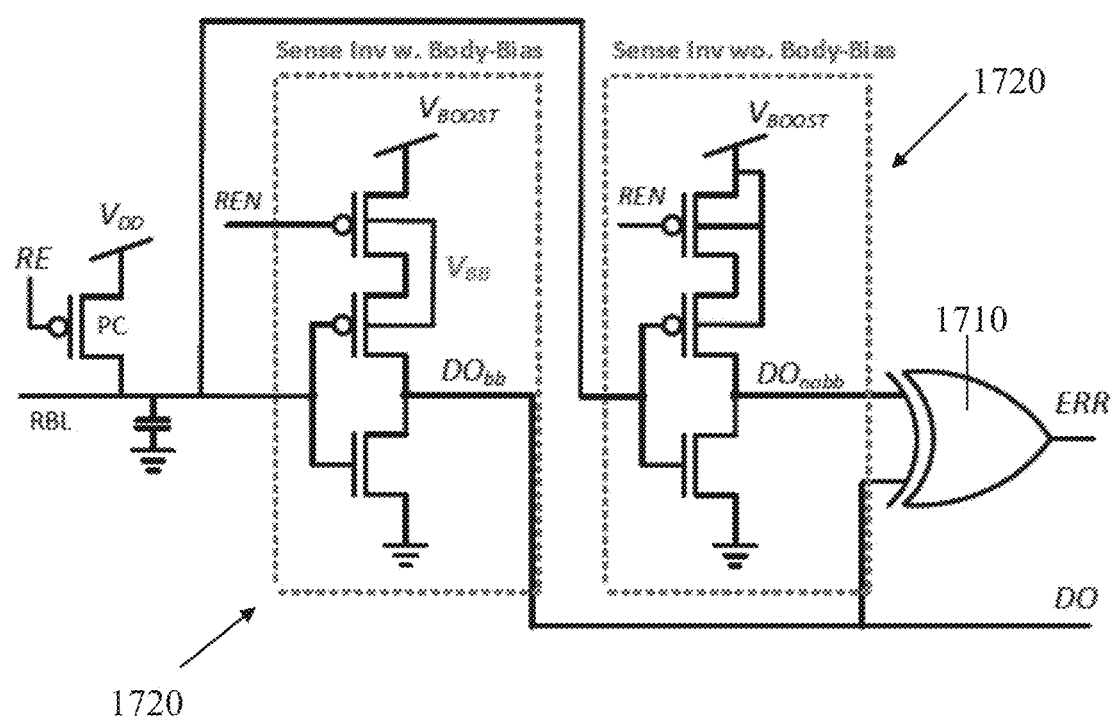
FIG. 17 is a simplified circuit diagram of an error-detecting readout circuit according to exemplary embodiments of the invention.

Reference is now made to FIG. 17, which is a simplified circuit diagram of an error-detecting readout circuit according to exemplary embodiments of the invention. To supplement the dynamically configurable sensing scheme with error detection, a second sense inverter without body-bias ($V_{BB}=V_{BOOST}$) is added in parallel to the regular readout path, providing dual-sampling. XOR gate 1710 is added to the output of both sense inverters (body-biased sense inverter 1720 and sense inverter 1730 without body-biasing). XOR gate 1710 compares the output of sense inverters 1720 and 1730, and indicates whether a readout error has occurred.

Figure 18A:
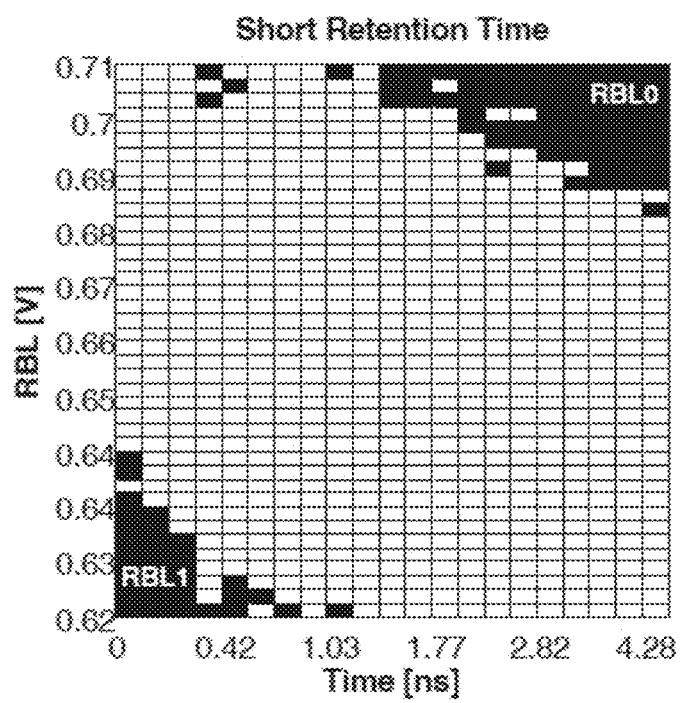
FIGS. 18A-18B are diagrams demonstrating the impact of different retention time periods on the RBL voltage during readout.
Figure 18B:
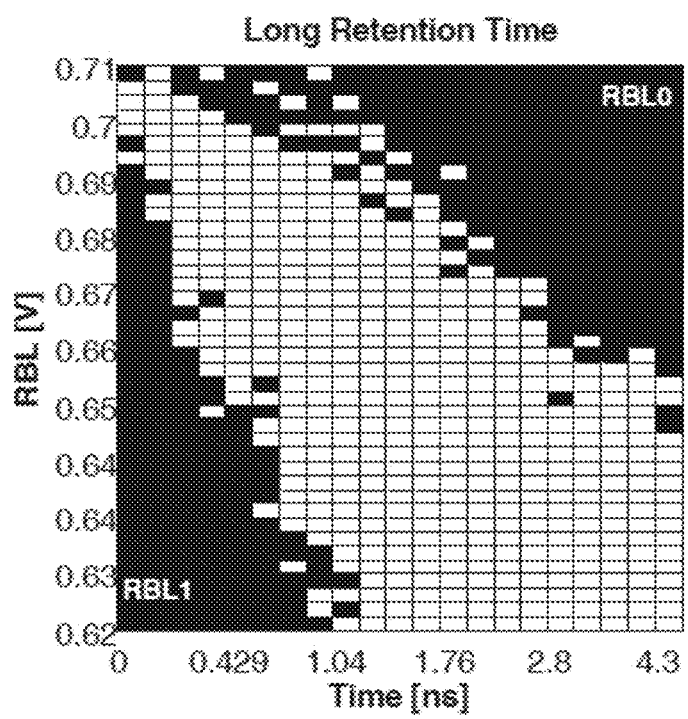

Based on the relation between $V_{BB}$ and $V_{SW}$, the RBL voltage was measured for different sampling times and reconstructed in FIGS. 18A-18B to obtain an "eye" diagram, demonstrating the impact of different retention time periods on the RBL voltage during readout. Every combination of sampling time and $V_{SW}$ results in a correct/wrong read, shown in white/black respectively. As clearly seen, the RBL discharge rate decreases for a stored '1' and increases for a stored '0', when readout is performed following a longer idle time after a write operation. The choice of $V_{SW}$ is therefore key to maximizing the DRT and adjusting the sampling instant based on the desired cycle time.

While the dynamic adjustment of $V_{BB}$ enables setting the optimal $V_{SW}$ under process variations and for different frequency constraints, the refresh rate must still be set according to the corresponding worst-case conditions, as extracted from high-sigma analysis. In order to avoid the large design guard bands incurred by the conventional worst-case refresh rate setting, the GC-eDRAM is provided with an error detection circuit, which enables to detect potential readout errors when the refresh rate is set too close to the DRT of the array. This allows eliminating refresh rate guard bands by dynamically adjusting it according to PVT variations and real-time operating conditions.

Figure 19A:
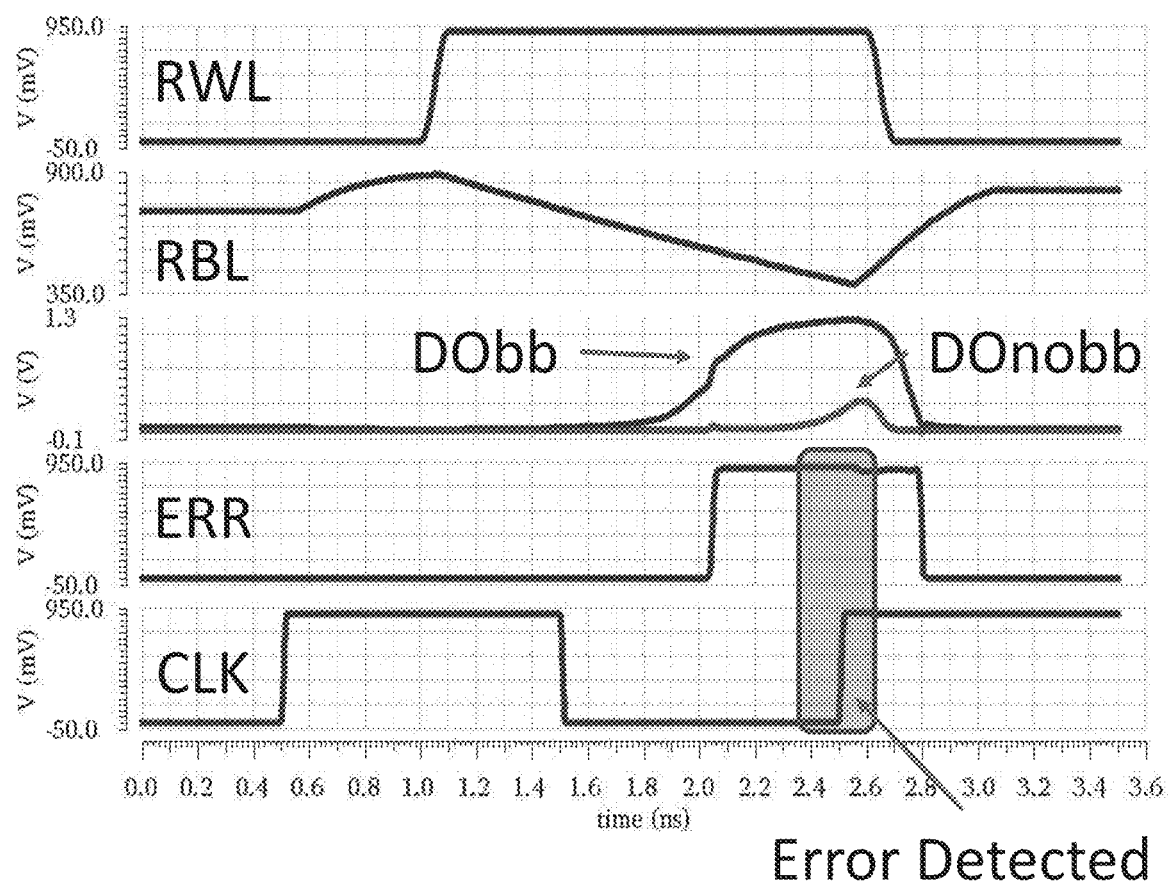
FIGS. 19A-19B demonstrate unsuccessful and successful read operations respectively by a body-biased error detection circuit, according to embodiments of the invention.

FIG. 19A demonstrates the detection of an error due to the slow discharge of the RBL. While the RBL voltage reduces below the higher switching threshold of the sense inverter with body-biasing (DObb), it remains above the switching threshold of the sense inverter without body-biasing (DOnobb), therefore resulting in the ERR signal going high prior to the clock edge to indicate that an error has occurred.

Figure 19B:
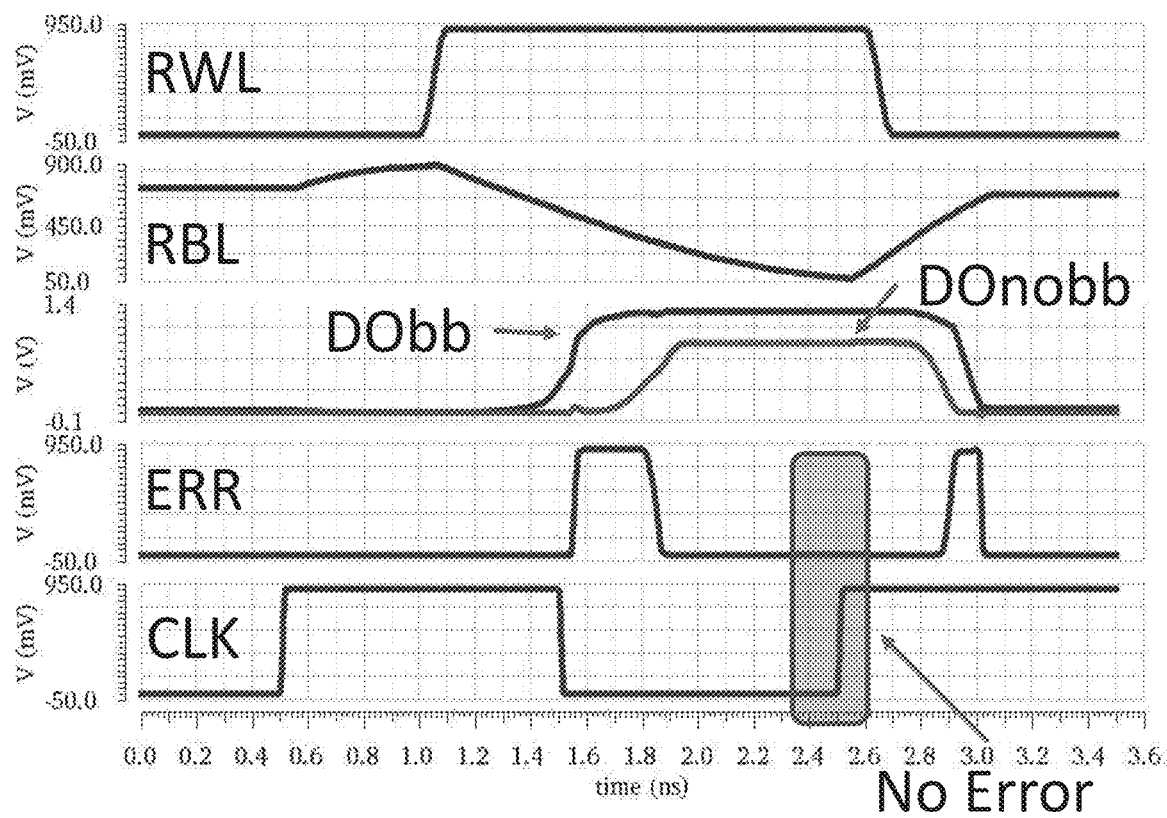

On the other hand, FIG. 19B demonstrates a successful read operation without an error, as the fast discharge of the RBL results in both sense inverters outputting a '1' at the end of the cycle, keeping the ERR signal low on the rising edge of the clock. Note that this scheme may already flag just the onset of an error, while the body-biased sense amplifier still provides a correct output so that the refresh rate may be adjusted continuously at runtime without compromising the correct functionality.

III.C. GC-eDRAM Macro with Body-Biased Compensated Readout and Error Detection

Figure 20:
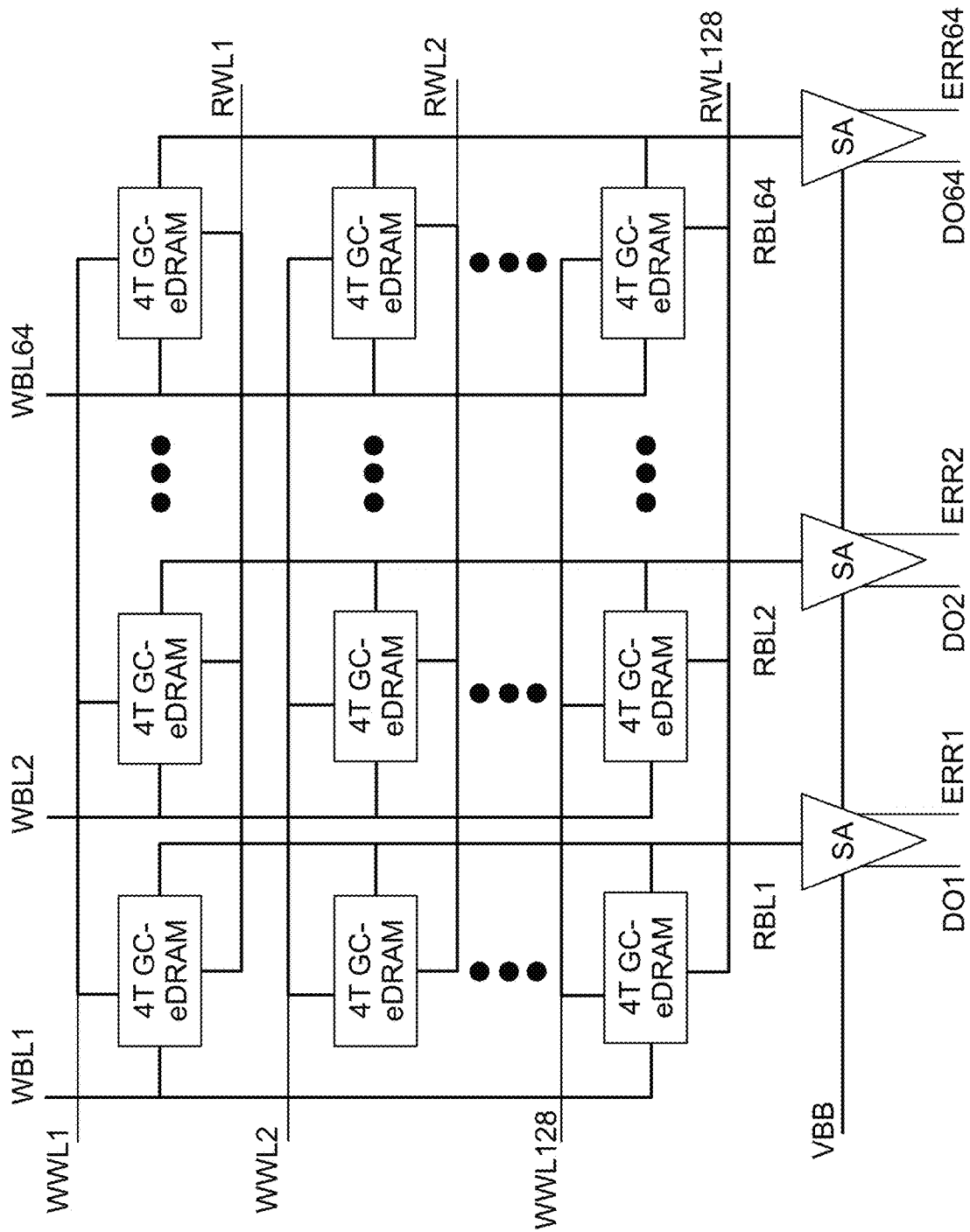
FIG. 20 is a simplified diagram of the architecture of a GC-eDRAM memory macro, according to an exemplary embodiment of the invention.
Figure 21:
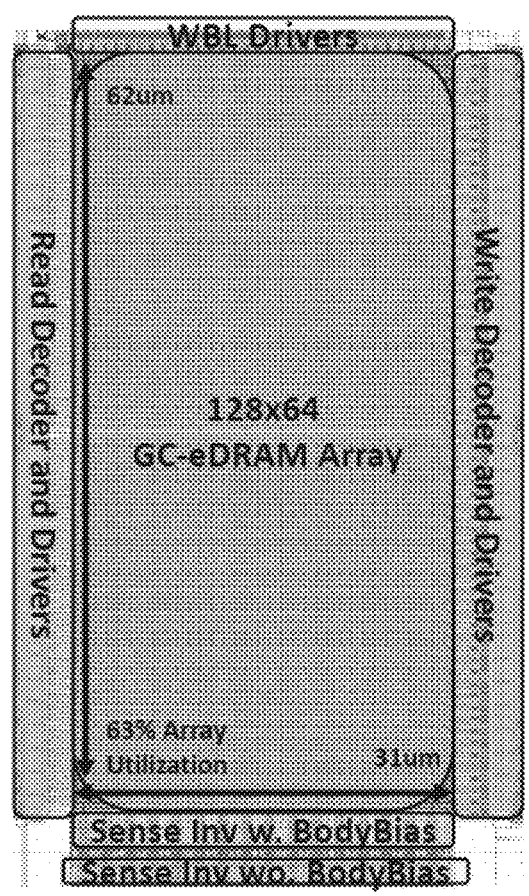
FIG. 21 is a simplified layout of the memory macro of FIG. 20.

Reference is now made to FIG. 20, which is a simplified diagram of the architecture of a GC-eDRAM memory macro, according to an exemplary embodiment of the invention. The memory macro includes a 128×64 bit GC-eDRAM array of 4T bitcells, with body-biased compensated readout and dual-sampling error detection. The memory macro was implemented in 28 nm FD-SOI technology. FIG. 21 is a simplified layout of the FIG. 20 memory macro.

The area of the implemented memory macro area measures 41 μm by 74 μm. The 4T GC-eDRAM array accounts for 63% of the total macro area and each of the sense inverter rows occupies less than 6% of the total macro area. A test-chip of the memory macro with integrated body-biasing and error detection as described herein was fabricated in a 28 nm FD-SOI process. The test chip implements a measurement setup including an onchip memory BIST, a clock generator, and a serial-interface for communication with an FPGA.

Figure 22:
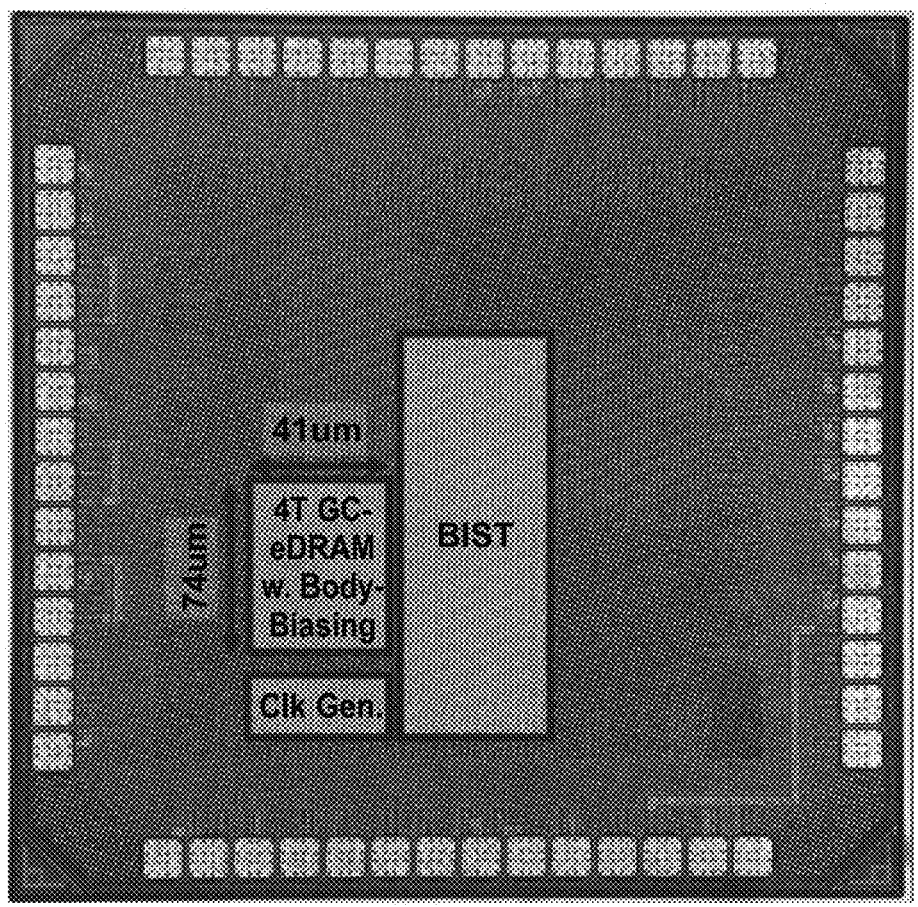
FIG. 22 is a micrograph of the manufactured die of the memory macro of FIG. 20.

Reference is now made to FIG. 22, which is a micrograph of the manufactured die of the memory macro of FIG. 20. Key features of the manufactured die are given in Table 1:

TABLE 1

| Technology | 28 nm FD-SOI |
|---|---|
| Array Type | 4T GC-eDRAM |
| Array Size | 8 kb |
| Features | Integrated body-biasing |
| | Dual-sampling error detection |
| Macro Area | 3034 μm² |
| VDD Range | 0.6 V-1.0 V |
| Temperature Range | 0 C.-125 C. |
| Frequency Range | 10 Mhz-150 Mhz |
| Avg. DRT Gain* | 3.8X |
| Avg. Energy Reduction* | 59% |

*Compared with guard-banded design

Test chips were packaged and connected to an FPGA evaluation board to communicate with the serial interface. The test chips were successfully tested for a $V_{DD}$ range of 0.6V-1V, a temperature range between 0-125 degrees Celsius (° C.), and operating frequencies ranging from 10 MHz-150 MHz under a nominal supply voltage of 0.9V.

Figure 23A:
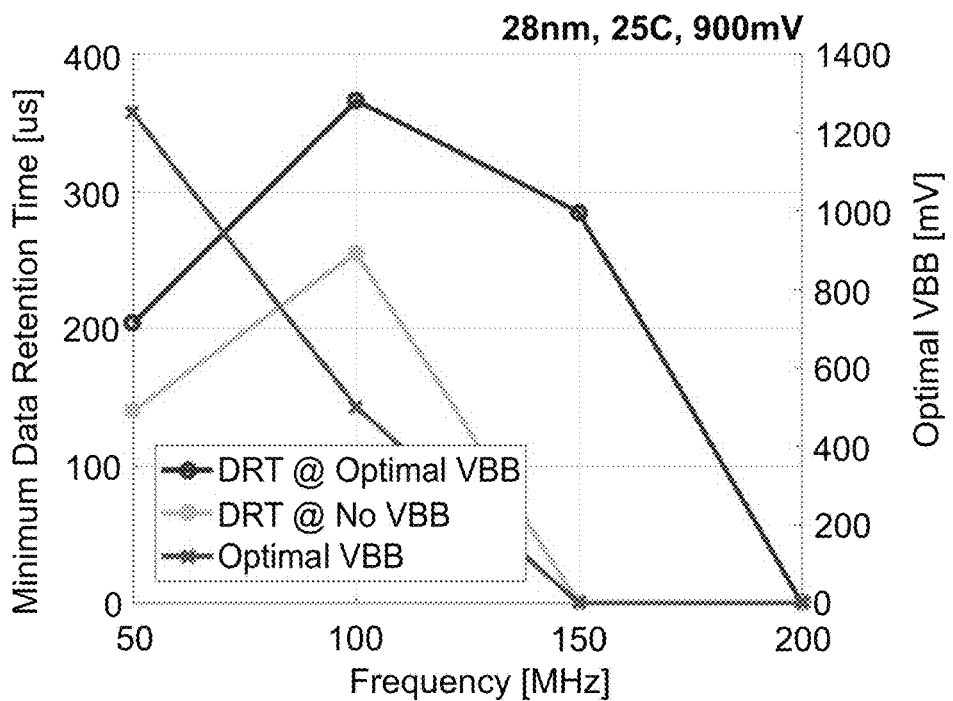
FIGS. 23A-23C show the measured DRT and the optimal $V_{BB}$ voltage under variations of several operating parameters.
Figure 23B:
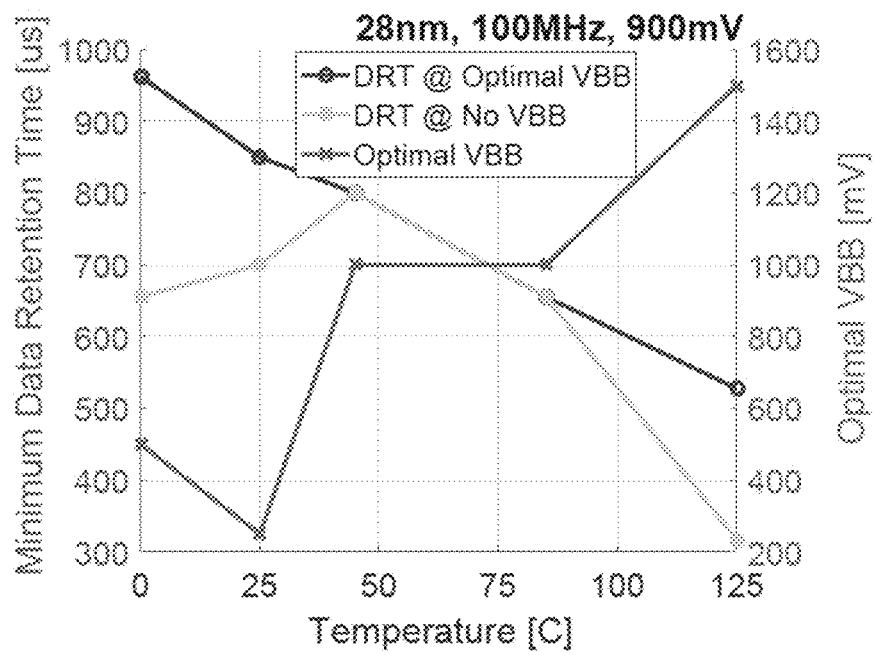
Figure 23C:
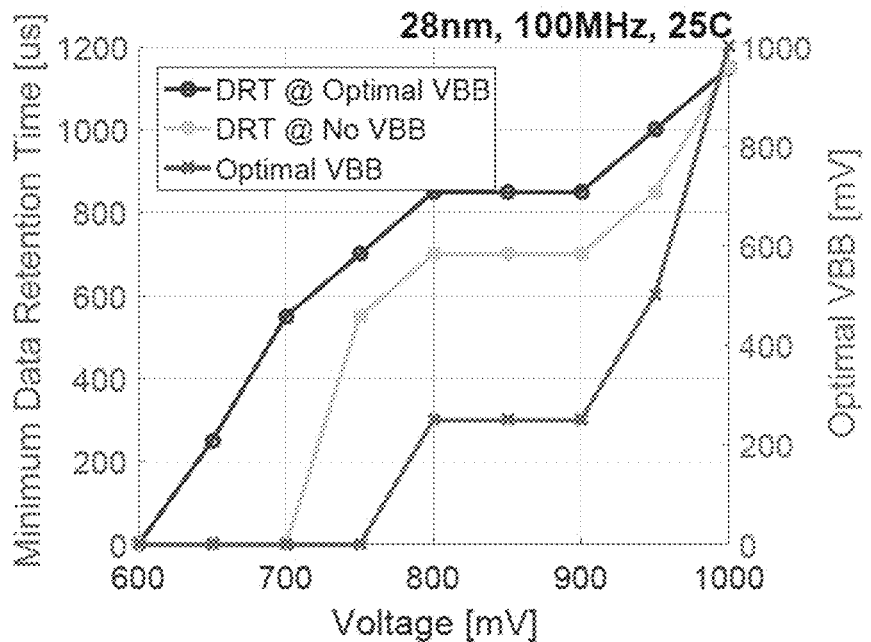

Reference is now made to FIGS. 23A-23C, which show the measured DRT and the optimal $V_{BB}$ voltage under variations of several operating parameters.

FIG. 23A shows the measured DRT and the optimal $V_{BB}$ voltage under different frequencies at room temperature and 0.9V $V_{DD}$. Higher frequencies require the RBL to discharge faster in order to cross the switching threshold of the sense inverter when reading out a '1'. Therefore, the minimum DRT decreases with frequency. Applying forward body-bias to the sense inverter by decreasing $V_{BB}$ increases the switching threshold and thus a higher DRT is obtained. The DRT of GC-eDRAM under an optimal body voltage achieves 18%-75% improvement as compared to a GC-eDRAM without body-bias. Moreover, the body-biased array provides successful operation at a wider frequency range, up-to 175 MHz.

FIG. 23B shows the effect of temperature variation on the DRT, measured under a 900 mV supply and a 100 MHz operating frequency. Temperature increase beyond 25° C. results in increased leakage from the cell, which causes the RBL to discharge faster when storing '0'. Therefore, $V_{SW}$ is reduced by increasing $V_{BB}$, resulting in up-to 66% improvement in the DRT compared to no body-bias, at 125° C. Temperature reduction from 25° C. to 0° C. results in faster RBL discharge due to increased mobility, thereby resulting in a 46% improvement in DRT by setting $V_{BB}$ to 500 mV.

FIG. 23C shows the measured DRT under supply voltage scaling, measured at room temperature and a 100 MHz operating frequency. As $V_{DD}$ is lowered, the drive strength of the read transistor reduces, hence the RBL discharges slower. Therefore decreasing $V_{BB}$ improves the DRT by increasing the switching threshold of the sense inverter. By applying the optimal $V_{BB}$ at each voltage, the DRT improves by up-to 30% compared to the DRT that is achieved without body-biasing. Furthermore, applying optimal body-biasing enables more aggressive voltage scaling, achieving successful operation with $V_{DD}$ scaled down to 650 mV at 100 MHz.

Figure 24:
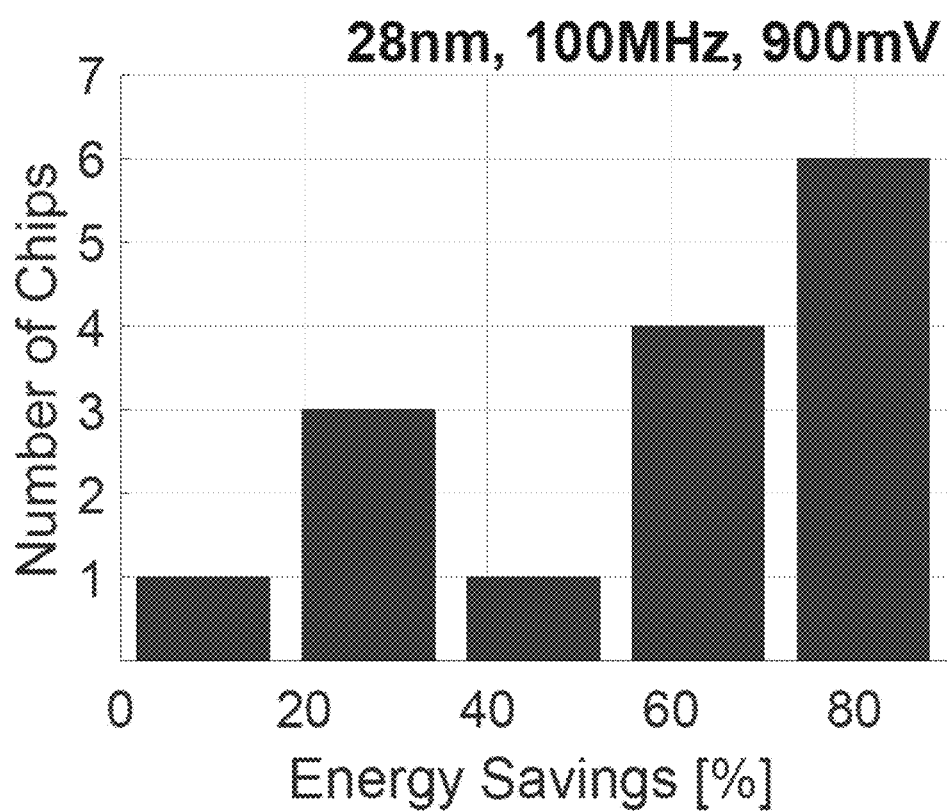
FIG. 24 shows energy savings using error detection according to exemplary embodiments of the invention.

FIG. 24 illustrates the advantages of the dual-sampling technique described herein, as compared to the guard-banded GC-eDRAM design which needs to account for the worst-case DRT across process variations to set the refresh rate. For this analysis, the energy savings are referred to the minimum DRT, as measured across fifteen chips having error detection circuitry with optimal $V_{BB}$ biasing. Energy savings distributions were measured across 20 dies at room temperature. The error detection circuitry enables retention energy savings of up-to 86% and an average of 59%. These measurements and results are summarized in Table 2, comparing between the FD-SOI GC-eDRAM with integrated body-biasing and dual-sampling (denoted Prop. design) to the conventional guard banded GC-eDRAM design (denoted Conv. design).

TABLE 2

| Memory type | Conv. design | Prop. design |
| --- | --- | --- |
| Min. $V_{DD}$ @ 100 MHz | 750 mV | 650 mV |
| Max. frequency @ 900 mV | 150 MHz | 175 MHz |
| Temperature range @ 100 MHz | 0° C.-125° C. | 0° C.-125° C. |
| DRT improvement vs. frequency | — | 75% |
| DRT improvement vs. temperature | — | 66% |
| DRT improvement vs. $V_{DD}$ | — | 30% |
| Average DRT gain (inter die) | — | 3.8× |
| Max. energy savings (inter die) | — | 86% |

As seen in Table 2, silicon measurements of a manufactured GC-eDRAM with integrated body-biasing and dual-sampling capabilities in 28 nm FD-SOI technology provide up-to 75% improvement in the DRT and up-to 86% energy savings compared to a guard banded GC-eDRAM design.

In conclusion, GC-eDRAM is an attractive alternative to SRAM, offering higher density, lower leakage and two-ported operation.

In some embodiments presented herein, FD-SOI PMOS and NMOS transistors in the same GC-eDRAM are body-biased with the same body voltage. Unlike in other manufacturing technologies, this special structure is possible FD-SOI as PMOS and NMOS transistors may be manufactured in a single well. The gain cell's DRT may be extended using reversed body bias, while at the same time improving the read access latency using forward body bias.

In alternate or additional embodiments, the DRT of the FD-SOI GC-eDRAMs is extended by applying adaptive body-biasing to the readout path. The switching threshold of the sense inverter may be adjusted according to real-time operating conditions.

A low-overhead dual-sampling mechanism may be integrated into the readout path, to provide error-detection capabilities to significantly reduce design guard bands.

In the case that new technologies are developed with the capacity of manufacturing PMOS and NMOS transistors in a single well, the above-described embodiments may be adapted to such new technologies.

It is expected that during the life of a patent maturing from this application many relevant gain cells, GC-eDRAMs, memory macros, sense inverters, readout circuitry and memory macro write ports and read ports will be developed and the scope of the terms gain cell, GC-eDRAM, memory macro, sense inverter, readout circuitry, write port and read port are intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

In addition, any priority document(s) of this application is/are hereby incorporated herein by reference in its/their entirety.

What is claimed is:

1. A gain cell, comprising:
   a write bit line terminal connected to a write bit line (WBL);
   a read bit line terminal connected to a read bit line (RBL);
   a write trigger terminal connected to a write word line (WWL) and adapted to input a write trigger signal;
   a read trigger terminal put connected to a read word line (RWL) and adapted to input a read trigger signal;
   at least one body voltage terminal connected to a respective body voltage; and
   a plurality of fully depleted silicon-on-insulator (FD-SOI) transistors interconnected to form a storage node for retaining a data signal, at least a first one and a second one of said transistors having respective bodies coupled in a first single well to a first body voltage terminal,
   wherein said write trigger signal triggers writing an input data signal from said write bit line terminal to said storage node and said read trigger signal triggers outputting said retained data signal to said read bit line terminal.

2. The gain cell according to claim 1, wherein said FD-SOI transistors comprise:
   at least one write transistor having a gate connected to said write trigger terminal, wherein when a write operation is triggered by said WWL said write bit line terminal is connected to said storage node; and
   at least one read transistor having a gate connected to said storage node, wherein when a read operation is triggered by said RWL said read bit line terminal and a diffusion connection of at least one of said read transistors are connected and disconnected according to a voltage level at said storage node.

3. The gain cell according to claim 1, wherein at least a third and a fourth of said transistors are coupled in a second single well to a second body voltage terminal.

4. The gain cell according to claim 1, wherein said plurality of FD-SOI transistors comprises at least one PMOS transistor and at least one NMOS transistor.

5. The gain cell according to claim 4, wherein said at least one PMOS transistor is a regular voltage threshold (RVT) transistor and said at least one NMOS transistor is a low voltage threshold (LVT) transistor, and said single well comprises an n-well.

6. The gain cell according to claim 5, wherein said first body voltage is a maximal bulk voltage of said first and second transistors.

7. The gain cell according to claim 4, wherein said at least one PMOS transistor is an LVT transistor and said at least one NMOS transistor is an RVT transistor, and said single well comprises a p-well.

8. The gain cell according to claim 7, wherein said first body voltage is a minimal bulk voltage of said first and second transistors.

9. The gain cell according to claim 1, further comprising an error detector connected to said read bit line terminal, said error detector comprising:
   a fast sense inverter, adapted to provide a first data output signal based on a signal at said read bit line terminal and a first switching threshold;
   a slow sense inverter, adapted to provide a second data output signal based on said signal at said read bit line terminal and a second switching threshold; and
   a comparator adapted to output an error signal when said first data output signal and said second data output signal are different,
   wherein respective switching speeds of said sense inverters are dependent on respective levels of said first switching threshold and said second switching threshold, and wherein said fast sense inverter provides said first output data signal faster than said slow sense inverter provides said second output data signal.

10. The gain cell according to claim 9, wherein said fast sense inverter is powered by a boosted supply voltage and said slow sense inverter is powered by a high supply voltage, wherein a difference between respective levels of said boosted supply voltage and said high power supply yields different respective switching thresholds for said fast sense inverter and said slow sense inverter.

11. The gain cell according to claim 9, wherein said fast sense inverter comprises an FD-SOI PMOS transistor and an FD-SOI NMOS transistor in series, and wherein at least one of said transistors of said fast sense inverter is body-biased.

12. The gain cell according to claim 11, wherein a respective voltage of said body-biasing is adjustable during gain cell operation.

13. The gain cell according to claim 9, wherein at least one of said fast sense inverter and said slow sense inverter is enabled and disabled by a respective enable signal.

14. A memory array comprising a plurality of gain cells according to claim 1, wherein respective write bit line terminals of said gain cells are connected to a common write bit line, and respective read bit line terminals of said gain cells are connected to a common read bit line.

15. The memory array according to claim 14, wherein at least one of said gain cells comprises at least one PMOS transistor and at least one NMOS transistor.

16. The memory array according to claim 15, wherein said at least one PMOS transistor is a regular voltage threshold (RVT) transistor and said at least one NMOS transistor is a low voltage threshold (LVT) transistor, and said single well comprises an n-well.

17. The memory array according to claim 15, wherein said at least one PMOS transistor is an LVT transistor and said at least one NMOS transistor is an RVT transistor, and said single well comprises a p-well.

18. The memory array according to claim 15, further comprising an error detector comprising:
a fast sense inverter, adapted to provide a first data output signal based on a signal at said read bit line terminal and a first switching threshold;
a slow sense inverter, adapted to provide a second data output signal based on said signal at said read bit line terminal and a second switching threshold; and
a comparator adapted to output an error signal when said first data output signal and said second data output signal are different,
wherein respective switching speeds of said sense inverters are dependent on respective levels of said first switching threshold and said second switching threshold, and wherein said fast sense inverter provides said first output data signal faster than said slow sense inverter provides said second output data signal.

19. A method of storing data in a gain cell, said gain cell comprising:
a write bit line terminal connected to a write bit line (WBL);
a read bit line terminal connected to a read bit line (RBL);
a write trigger terminal connected to a write word line (WWL) and adapted to input a write trigger signal;
a read trigger terminal put connected to a read word line (RWL) and adapted to input a read trigger signal;
at least one body voltage terminal connected to a respective body voltage; and
a plurality of fully depleted silicon-on-insulator (FD-SOI) transistors interconnected to form a storage node for retaining a data signal and comprising at least one write transistor having a gate connected to said write trigger terminal and at least one read transistor having a gate connected to said storage node, at least two of said transistors having respective bodies coupled in a first single well to a first body voltage terminal,
said method comprising:
writing data to said gain cell, when a write operation is triggered by said write trigger signal, by connecting said write bit line terminal and said storage node via said at least one write transistor using said write trigger signal; and
reading data from said gain cell, when a read operation is triggered by said read trigger signal, by connecting and disconnecting said read bit line terminal and a diffusion connection of one of said read transistors based on a voltage level at said storage node.

20. The method according to claim 19, wherein said diffusion connection of said read transistor is connected to one of:
a supply voltage;
ground; and
said read trigger terminal.

21. The method according to claim 19, wherein said plurality of FD-SOI transistors comprises at least one PMOS transistor and at least one NMOS transistor.

22. The method according to claim 21, wherein said at least one PMOS transistor is a regular voltage threshold (RVT) transistor and said at least one NMOS transistor is a low voltage threshold (LVT) transistor, and said single well comprises an n-well.

23. The method according to claim 21, wherein said at least one PMOS transistor is an LVT transistor and said at least one NMOS transistor is an RVT transistor, and said single well comprises a p-well.

24. A body-biased sense inverter comprising:
an input terminal;
a data output terminal;
a first FD-SOI PMOS transistor having a first diffusion connection, a gate connection, a second diffusion connection and a bulk connection;
a first FD-SOI NMOS transistor having a first diffusion connection, a gate connection, a second diffusion connection and a bulk connection; and
a non-biased sense inverter comprising:
a third FD-SOI PMOS transistor having a first diffusion connection, a gate connection, a second diffusion connection and a bulk connection; and
a third FD-SOI NMOS transistor having a first diffusion connection, a gate connection, a second diffusion connection and a bulk connection, wherein said bulk connection of said third PMOS transistor and said first diffusion connection of said third PMOS transistor are connected to a high supply voltage, said gate connections of said third PMOS transistor and said third NMOS transistor are connected to said data input terminal, and said bulk connection of said third NMOS transistor and said second diffusion connection of said third NMOS transistor are connected to a low supply voltage; and
a comparator having an error detection output terminal, a first input connected to said data output terminal and a second input connected to said second diffusion connection of said third PMOS transistor and said first diffusion connection of said third NMOS transistor, adapted to output an error signal at said error detection output terminal when respective signals at said first input and at said second input are different,
wherein at least one of said bulk connections is connected to a respective body voltage, said gate connections of said first PMOS transistor and said first NMOS transistor are connected to said data input terminal, and said second diffusion connection of said first PMOS transistor and said first diffusion connection of said first NMOS transistor are connected to said data output terminal.

25. The body-biased sense inverter according to claim 24, comprising one of:
a second FD-SOI PMOS transistor between said first diffusion connection of said first PMOS transistor and a high supply voltage, adapted to connect and disconnect said first diffusion connection of said first PMOS transistor and said high supply voltage in accordance with a respective enable signal; and
a direct connection between said first diffusion connection of said first PMOS transistor and said high supply voltage.

26. The body-biased sense inverter according to claim 24, comprising one of:
a second FD-SOI NMOS transistor between said second diffusion connection of said first NMOS transistor and a low supply voltage, adapted to connect and disconnect said second diffusion connection of said first NMOS transistor and said low supply voltage in accordance with a respective enable signal; and a direct connection between said second diffusion connection of said first NMOS transistor and said low supply voltage.

27. The body-biased sense inverter according to claim 24, wherein at least one of said body voltages is dynamically adjustable during operation of said body-biased sense inverter.

28. The body-biased sense inverter according to claim 24, further comprising at least one of:

a fourth FD-SOI PMOS transistor between said first diffusion connection of said third PMOS transistor and said high supply voltage, adapted to connect and disconnect said first diffusion connection of said first PMOS transistor and said high supply voltage in accordance with a respective enable signal; and a fourth FD-SOI NMOS transistor between said second diffusion connection of said third NMOS transistor and said low supply voltage, adapted to connect and disconnect said second diffusion connection of said first NMOS transistor and said low supply voltage in accordance with a respective enable signal.

29. The body-biased sense inverter according to claim 24, further comprising a body-bias supply adapted to provide at least one of said body voltages.

\* \* \* \* \*